(12) United States Patent
Lee

(10) Patent No.: US 11,765,928 B2
(45) Date of Patent: Sep. 19, 2023

(54) DISPLAY DEVICE INCLUDING TRANSMISSION AREA WITH GROOVED SUBSTRATE OR LOWER METAL PATTERNS

(71) Applicant: Samsung Display Co., Ltd., Yongin-si (KR)

(72) Inventor: Seunghoon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 228 days.

(21) Appl. No.: 17/060,784

(22) Filed: Oct. 1, 2020

(65) Prior Publication Data
US 2021/0202900 A1    Jul. 1, 2021

(30) Foreign Application Priority Data

Dec. 31, 2019    (KR) .......................... 10-2019-0179548

(51) Int. Cl.
| | | |
|---|---|---|
| *H01L 51/52* | (2006.01) | |
| *H01L 27/14* | (2006.01) | |
| *H01L 27/32* | (2006.01) | |
| *G02F 1/13* | (2006.01) | |
| *G02F 1/1362* | (2006.01) | |

(Continued)

(52) U.S. Cl.
CPC ...... *H01L 51/5253* (2013.01); *H01L 27/3265* (2013.01); *G02F 1/133512* (2013.01); *G02F 1/136209* (2013.01); *G09G 2300/0408* (2013.01); *G09G 2300/0804* (2013.01); *H01L 27/14678* (2013.01); *H01L 27/322* (2013.01); *H01L 27/323* (2013.01); *H01L 27/3211* (2013.01); *H01L 27/3216* (2013.01); *H01L 27/3218* (2013.01); *H01L 27/3246* (2013.01); *H01L 51/5246* (2013.01); *H01L 2251/301* (2013.01)

(58) Field of Classification Search
CPC .......... H01L 51/5253; H01L 2251/301; H01L 27/3211; H01L 27/3216; H01L 27/3218; H01L 51/5246; H01L 2251/558; H01L 27/323; H01L 27/14678; H01L 27/322; H01L 27/3246; H01L 27/3265; G02F 1/133512; G02F 1/136209; G02F 2001/133357; G09G 2300/0408; G09G 2300/0804
See application file for complete search history.

(56) References Cited

U.S. PATENT DOCUMENTS

| | | | |
|---|---|---|---|
| 8,947,627 B2 | 2/2015 | Rappoport et al. | |
| 11,137,645 B2 * | 10/2021 | Baek | ..................... G02F 1/1339 |
| 2016/0233289 A1 * | 8/2016 | Son | ....................... H01L 27/326 |

(Continued)

FOREIGN PATENT DOCUMENTS

| | | |
|---|---|---|
| KR | 10-2017-0087635 | 7/2017 |
| KR | 10-2018-0121329 | 11/2018 |

(Continued)

*Primary Examiner* — Ida M Soward
(74) *Attorney, Agent, or Firm* — Kile Park Reed & Houtteman PLLC

(57) ABSTRACT

A display device includes a substrate including a display area and a component area including a transmission area, and display elements disposed on the substrate. The substrate includes grooves corresponding to the transmission area of the component area.

21 Claims, 27 Drawing Sheets

(51) Int. Cl.
 *H01L 27/146* (2006.01)
 *G02F 1/1335* (2006.01)

(56) References Cited

U.S. PATENT DOCUMENTS

| | | | |
|---|---|---|---|
| 2017/0212613 A1 | 7/2017 | Hwang et al. | |
| 2019/0245159 A1* | 8/2019 | Kim | H01L 51/5246 |
| 2019/0393444 A1* | 12/2019 | Nam | H01L 51/5253 |
| 2020/0106045 A1* | 4/2020 | Han | H01L 27/3246 |
| 2020/0119304 A1* | 4/2020 | Choi | H01L 51/52 |
| 2020/0127233 A1* | 4/2020 | Sung | G06F 3/0443 |
| 2020/0144341 A1* | 5/2020 | Choi | H01L 27/3258 |
| 2020/0161582 A1* | 5/2020 | Choi | H01L 51/5253 |
| 2020/0176538 A1* | 6/2020 | Um | H01L 51/5237 |
| 2020/0258953 A1 | 8/2020 | Bae et al. | |
| 2020/0312933 A1* | 10/2020 | Lee | H01L 51/0017 |
| 2020/0313101 A1* | 10/2020 | Jung | H01L 51/5253 |
| 2021/0151715 A1* | 5/2021 | Lee | H01L 51/5253 |
| 2021/0234122 A1* | 7/2021 | Choi | H01L 51/5253 |
| 2021/0320276 A1* | 10/2021 | Chang | H01L 27/3258 |
| 2021/0359051 A1* | 11/2021 | Jin | H01L 27/323 |

FOREIGN PATENT DOCUMENTS

| | | |
|---|---|---|
| KR | 10-2019-0053732 | 5/2019 |
| KR | 10-2020-0099251 | 8/2020 |

\* cited by examiner

DISPLAY DEVICE INCLUDING TRANSMISSION AREA WITH GROOVED SUBSTRATE OR LOWER METAL PATTERNS

CROSS-REFERENCE TO RELATED APPLICATION(S)

This application claims priority to and benefits of Korean Patent Application No. 10-2019-0179548 under 35 U.S.C. § 119, filed in the Korean Intellectual Property Office on Dec. 31, 2019, the entire contents of which are incorporated herein by reference.

BACKGROUND

1. Technical Field

One or more embodiments relate to a display device including a transmission area.

2. Description of the Related Art

Display devices have been used for various purposes. As thickness and weight of display devices have been reduced, utilization of display devices has increased.

In a display device, various functions related to a display device are being added while at the same time increasing a display area. Research into a display device having a region capable of performing various functions while also displaying images is being performed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may provide a display device, in which diffraction of light passing through a transmission area may be reduced.

Additional aspects will be set forth in part in the description which follows and, in part, will be apparent from the description, or may be learned by practice of the presented embodiments of the disclosure.

According to an embodiment, a display device may include a substrate including display area and a component area including a transmission area, and display elements disposed on the substrate. The substrate may include grooves corresponding to the transmission area of the component area.

The grooves may respectively extend to form a closed line shape in the transmission area.

The grooves may include a first groove and a second groove, the first groove surrounding the second groove.

The grooves may be symmetrically disposed based on a central line that may be perpendicular to an upper surface of the substrate.

The substrate may include a base layer and a barrier layer disposed on the base layer, the barrier layer may include a first transmission hole corresponding to the transmission area, the grooves may be disposed in the base layer and extending to the first transmission hole, and a depth of the grooves may be substantially same as a thickness of the base layer.

The display device may further include an insulating layer disposed between the substrate and the display elements, the insulating layer including a second transmission hole corresponding to the transmission area, and a thin film encapsulation layer including an inorganic encapsulation layer and an organic encapsulation layer, the thin film encapsulation layer covering the display elements.

The inorganic encapsulation layer may extend to the second transmission hole and may be arranged along the grooves.

The organic encapsulation layer may extend to the second transmission hole to be in the grooves.

A width of one of the grooves may be substantially same as a width of another one of the grooves.

A width of one of the grooves may be different from a width of another one among the grooves.

The display device may further include protrusions disposed between adjacent ones of the grooves. A width of one of the protrusions may be different from a width of another one of the protrusions.

The display device may further include a component under the substrate, the component corresponding to the component area.

According to another embodiment, a display device may include a substrate including a display area including a first display element, a component area including a second display element and a transmission area, and lower metal patterns on the substrate, the lower metal patterns corresponding to the transmission area and being disposed apart from one another.

The lower metal patterns may respectively extend to form a closed line shape in the transmission area. The lower metal patterns may include a first lower metal pattern and a second lower metal pattern, the first lower metal pattern surrounding the second lower metal pattern.

The lower metal patterns may be symmetrically disposed based on a central line that may be perpendicular to an upper surface of the substrate.

The lower metal patterns may have widths that are substantially same as one another, and intervals among the lower metal patterns may be substantially same as each other.

An interval between adjacent ones of the lower metal patterns may be different from an interval between other adjacent ones of the lower metal patterns.

A width of a first lower metal pattern may be different from a width of a second lower metal pattern.

The display device may further include a lower metal layer between the substrate and the second display element, wherein the lower metal patterns and the lower metal layer may be disposed in a same layer.

The display device may further include a buffer layer covering the lower metal layer, the buffer layer including a third transmission hole corresponding to the transmission area, wherein the lower metal patterns may be disposed in the third transmission hole.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
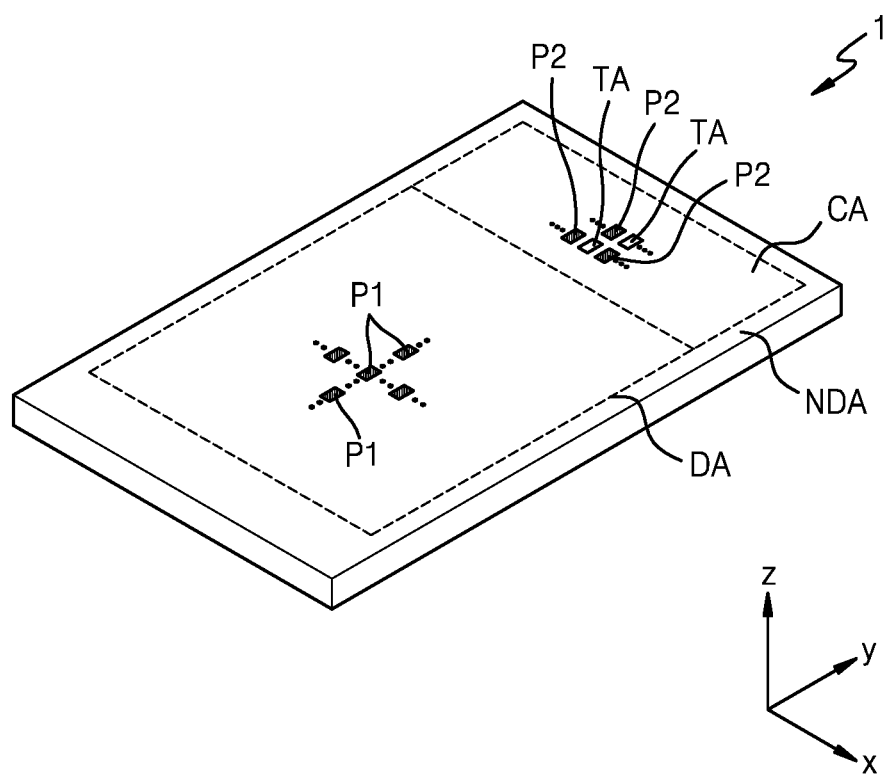
FIG. 1A is a schematic perspective view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof.

While such terms as "first," "second," etc., may be used to describe various components, such components are not to be limited to the above terms. The above terms are used only to distinguish one component from another.

An expression used in the singular encompasses the expression of the plural, unless it has a clearly different meaning in the context.

It is to be understood that terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on another layer, region, or component. For example, intervening layers, regions, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

Terms such as "overlap" may include layer, stack, face or facing, extending over, extending under, covering or partly covering or any other suitable term as would be appreciated and understood by those of ordinary skill in the art.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

A display device 1 may be a device for displaying images, and may include a mobile device that may be portable, for example, a game console, a multimedia device, and an ultra-small PC. The display device 1 that will be described later may include a liquid crystal display, an electrophoretic display, an organic light-emitting display, an inorganic light-emitting display, a field emission display, a surface-conduction electron-emitter display, a quantum dot display, a plasma display, a cathode ray display, etc. Hereinafter, according to an embodiment, it is considered that the display device 1 may be an organic light-emitting display device, but the display device of the disclosure is not limited thereto. For example, various types of display devices as mentioned above may be used.

Figure 1B:
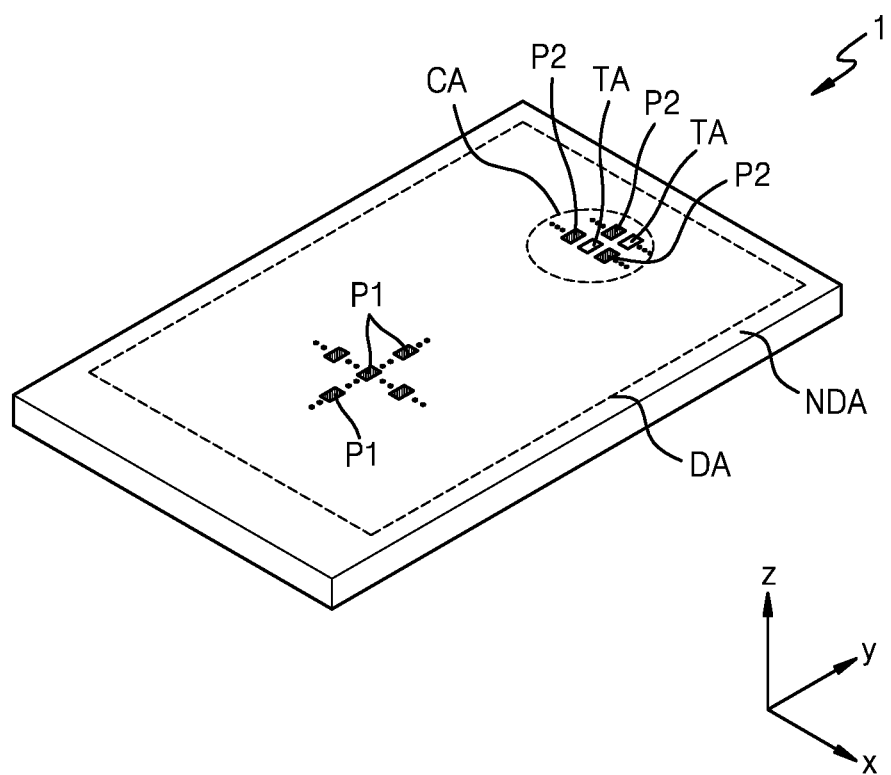
FIG. 1B is a schematic perspective view of a display device according to another embodiment.

FIG. 1A is a schematic perspective view of the display device 1 according to an embodiment. FIG. 1B is a schematic perspective view of the display device 1 according to another embodiment.

Referring to FIG. 1A, the display device 1 may include a display area DA, a component area CA, and a non-display area NDA. The component area CA may display images and may include components arranged therein.

The display area DA may realize images. First pixels P1 may be in the display area DA. Here, a first image may be provided by using light emitted from the first pixels P1.

The component area CA may realize images and may include a component (not shown). The component may include a sensor or a camera using an infrared ray, a visible ray, or sound, as described below with reference to FIGS. 2A to 2C.

In an embodiment, the component area CA may be at least partially surrounded by the display area DA. In FIG. 1A, the component area CA may be adjacent to (e.g., at a side of) the display area DA as a bar type, but the component area CA may be variously located in the non-display area NDA.

The component area CA may include a transmission area TA, through which light and/or sound output from the component may transmit to outside or proceeding from outside to the component. The transmission area TA may not include a pixel. Here, when an infrared ray may pass through the transmission area TA, an infrared ray transmittance of the component area CA may be about 15% or greater, for example, about 20% or greater, about 25% or greater, about 85% or greater, or about 90% or greater.

Second pixels P2 may be in the component area CA and may emit light to provide a second image. Here, the first image and the second image may be some parts of one image provided by the display device 1. As another example, the first image and the second image may be separate images independent from each other.

The non-display area NDA may not provide an image, and thus may not include a pixel. The non-display area NDA may be adjacent to (e.g., entirely surround) the display area DA and the component area CA. Drivers, etc., for providing electrical signals or electric power to the first pixels P1 and the second pixels P2, may be in the non-display area NDA. The non-display area NDA may include a pad portion to which an electronic device, a printed circuit board, etc. may be electrically connected.

Referring to FIG. 1B, the component area CA may be entirely surrounded by the display area DA.

In an embodiment, the component area CA may have a circular shape or an elliptical shape in a plan view. In another embodiment, the component area CA may have a polygonal shape such as a rectangular shape, etc. in a plan view. In another embodiment, the component area CA may include a curvature area. Also, the location of the component area CA and the number of component areas CA may vary.

Figure 2A:
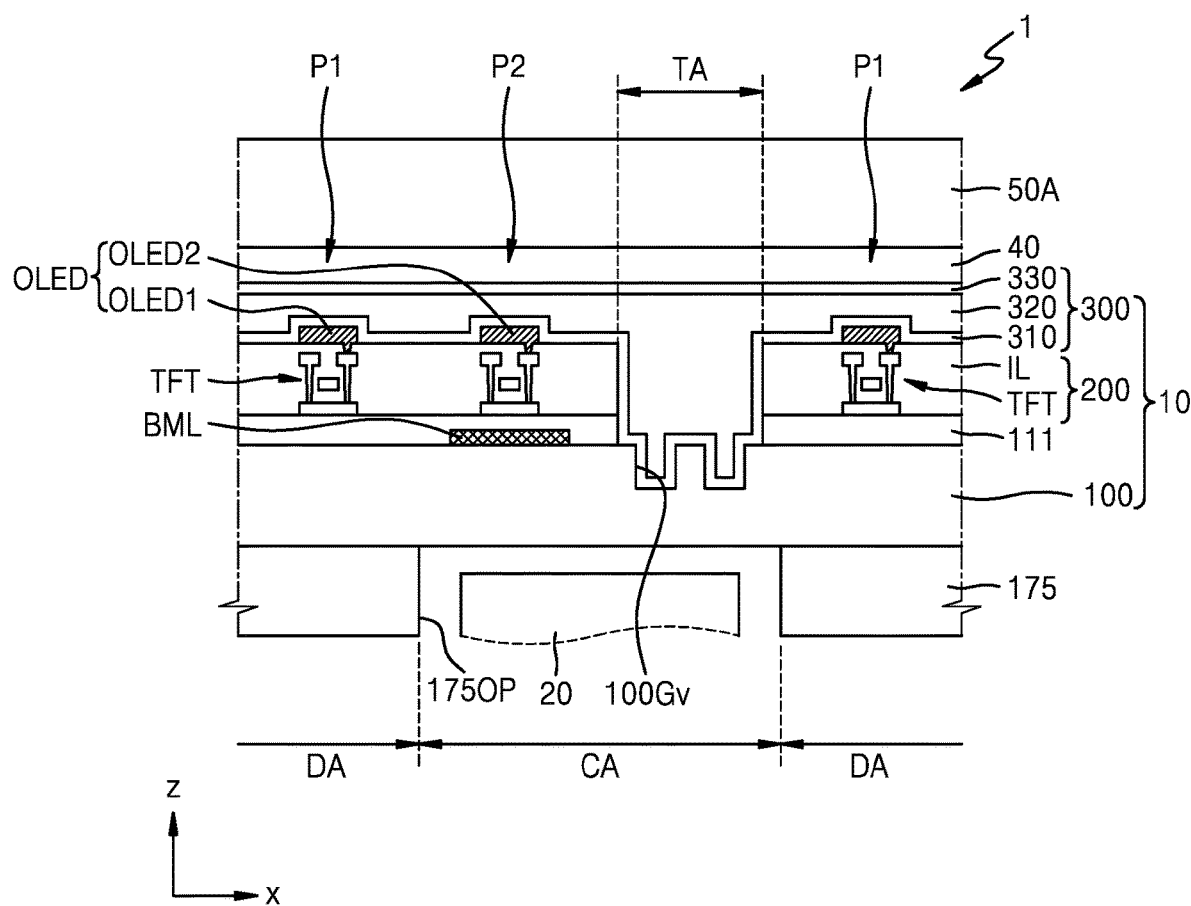
FIGS. 2A to 2C are schematic cross-sectional views partially showing a display device according to an embodiment.
Figure 2B:
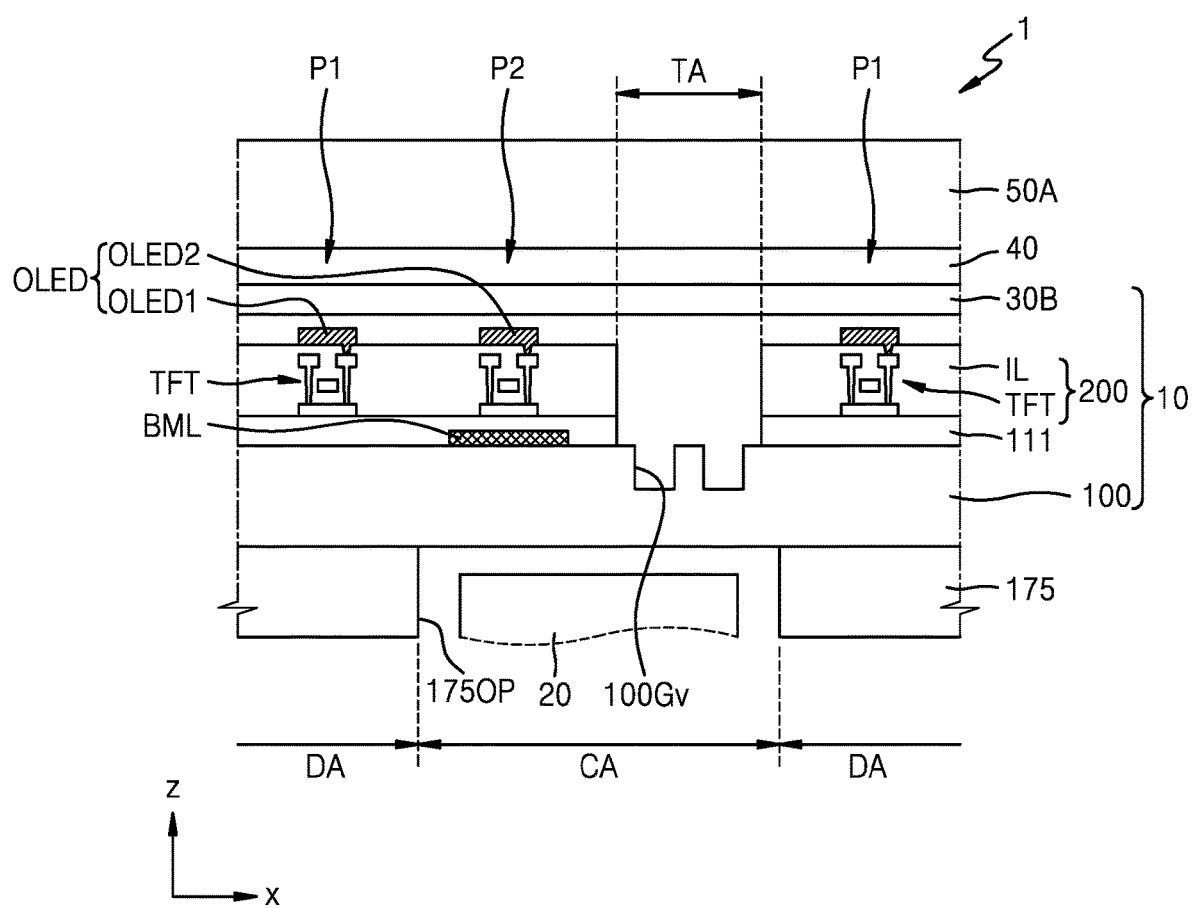
Figure 2C:
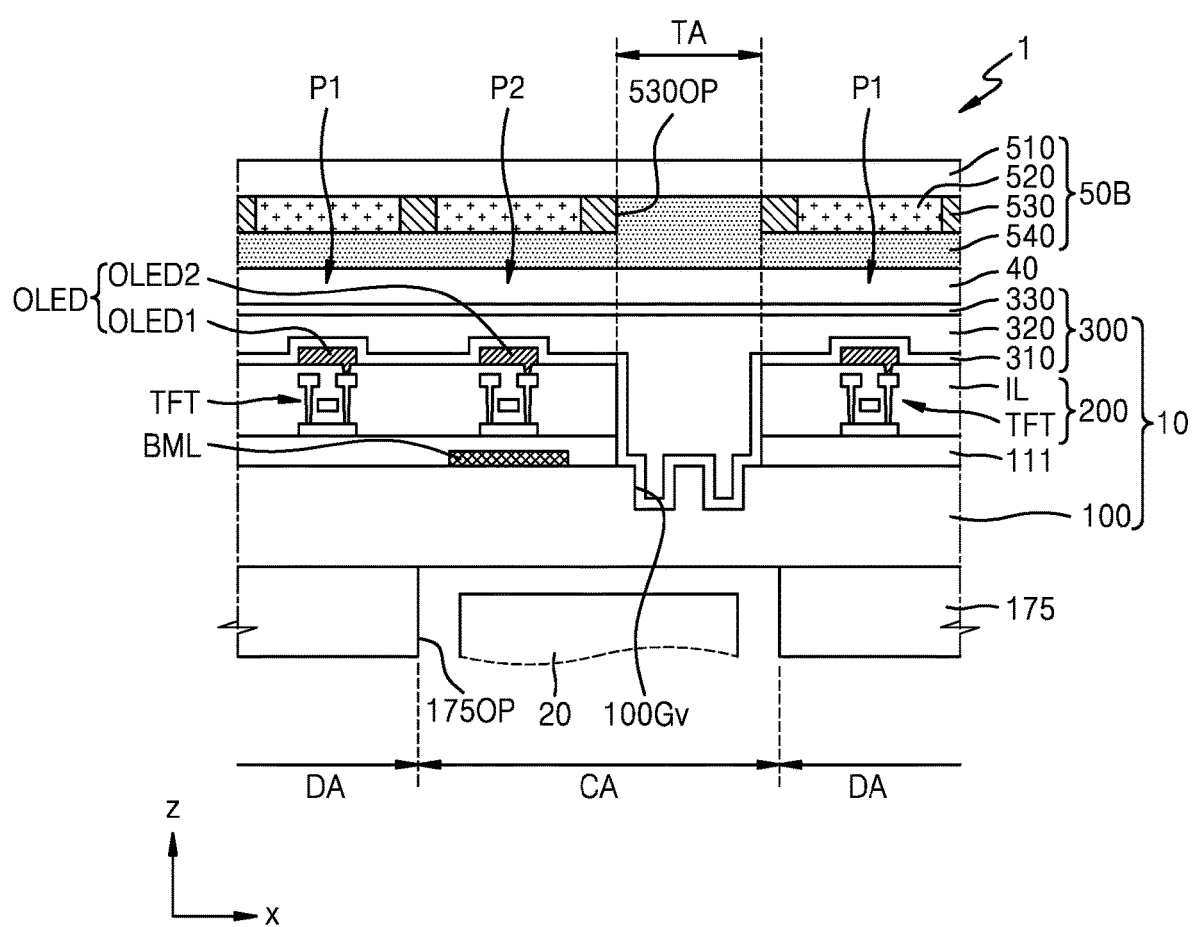

FIGS. 2A to 2C are schematic cross-sectional views partially showing a display device 1 according to an embodiment.

Referring to FIGS. 2A to 2C, the display device 1 may include a display panel 10 and a component 20 overlapping the display panel 10.

In particular, referring to FIG. 2A, the display panel 10 includes a substrate 100, a display layer 200 on the substrate 100, a thin film encapsulation layer 300 on the display layer 200, and an optical functional layer such as a touch input layer 40 and an optical plate 50A. Here, the substrate 100 may be understood to include a display area DA, a component area CA, and a non-display area (not shown).

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri-acetate, cellulose acetate propionate, etc., or a combination thereof. The substrate 100 including the polymer resin may be flexible, rollable, or bendable. The substrate 100 may have a multi-layered structure including a base layer including the above mentioned polymer resin and a barrier layer (not shown).

In an embodiment, the substrate 100 may include grooves 100Gv. Here, the grooves 100Gv may correspond to the transmission area TA. The grooves 100Gv may be provided to prevent diffraction of light discharged from the component 20 or light incident to the component 20. This will be described later. In another embodiment, the substrate 100 may include a lower conductive pattern corresponding to the transmission area TA, instead of the grooves 100Gv. The lower conductive pattern and that of a lower metal layer BML may be at a same layer.

The display layer 200 may be on an upper surface of the substrate 100, and a lower protective film 175 may be on a lower surface of the substrate 100, wherein the lower surface may be opposite to the upper surface. The lower protective film 175 may be attached to the lower surface of the substrate 100. An adhesive layer may be between the lower protective film 175 and the substrate 100. As another example, the lower protective film 175 may be on (e.g., directly on) the lower surface of the substrate 100, and an adhesive layer may not be provided between the lower protective film 175 and the substrate 100.

The lower protective film 175 may support and protect the substrate 100. The lower protective film 175 may include an opening 1750P corresponding to the component area CA. In case that the lower protective film 175 includes the opening 1750P, a transmittance of the component area CA, e.g., a light transmittance of the transmission area TA, may be improved. The lower protective film 175 may include polyethylene terephthalate or polyimide, or a combination thereof. In case that the substrate 100 includes glass, the lower protective film 175 may be omitted.

The display layer 200 may include a buffer layer 111, an insulating layer IL, a circuit layer including a thin film transistor TFT, and a display element layer including a display element, e.g., an organic light-emitting diode OLED. The thin film transistors TFT and the organic light-emitting diodes OLED electrically connected to the thin film transistors TFT may be in the display area DA and the component area CA. The component area CA may include the transmission area TA, in which the thin film transistor TFT and the organic light-emitting diode OLED may not be provided. In other words, the display area DA may include a first organic light-emitting diode OLED1 that may be a first display element, and the component area CA may include the transmission area TA and a second organic light-emitting diode OLED2 that may be a second display element. Hereinafter, the organic light-emitting diode OLED will be described in detail because the first organic light-emitting diode OLED1 and the second organic light-emitting diode OLED2 may be the same as or similar to each other.

The buffer layer 111 may be on the substrate 100 to reduce or block infiltration of impurities, moisture, or external air from below the substrate 100, and to provide a flat surface on the substrate 100. The buffer layer 111 may include an inorganic material such as an oxide material or a nitride material, an organic material, or an inorganic-organic composite material, and may have a single-layered or multi-layered structure including the inorganic material and the organic material. In some embodiments, the buffer layer 111 may include silicon oxide ($SiO_2$) or silicon nitride ($SiN_x$), or a combination thereof.

In an embodiment, the lower metal layer BML may be in the component area CA. Here, the lower metal layer BML may correspond to the second pixels P2. For example, the lower metal layer BML may correspond to the thin film transistor TFT in the component area CA. Therefore, the lower metal layer BML may prevent external light from reaching the thin film transistor TFT. A constant voltage or a signal may be applied to the lower metal layer BML to prevent damage to the pixel circuit due to an electrostatic discharge. Although not shown in FIG. 2A, in some embodiments, the lower metal layer BML may correspond to the first pixels P1 in the display area DA.

The lower metal layer BML may be between the substrate 100 and the buffer layer 111. As another example, the buffer layer 111 may include a first buffer layer and a second buffer layer, and the lower metal layer BML may be between the first buffer layer and the second buffer layer. Hereinafter, an example in which the lower metal layer BML may be between the substrate 100 and the buffer layer 111 will be described below.

In an embodiment, the buffer layer 111 and the insulating layer IL may each include a transmission hole. Therefore, a transmittance of light (including, e.g., a signal) output from the component 20 to outside or proceeding from outside towards the component may be improved. In some embodiments, the buffer layer 111 and the insulating layer IL may not include a transmission hole.

The thin film encapsulation layer 300 may cover the display layer 200. In an embodiment, the thin film encapsulation layer 300 may include at least one inorganic encapsulation layer and at least one organic encapsulation layer. In this regard, FIG. 2A shows a first inorganic encapsulation layer 310 and a second inorganic encapsulation layer 330, and an organic encapsulation layer 320 between the first and second inorganic encapsulation layers 310 and 330.

The first inorganic encapsulation layer 310 and the second inorganic encapsulation layer 330 may each include one or more inorganic materials from aluminum oxide, titanium oxide, tantalum oxide, hafnium oxide, zinc oxide, silicon nitride, and silicon oxynitride. The organic encapsulation layer 320 may include a polymer-based material. The polymer-based material may include an acryl-based resin, an epoxy-based resin, polyimide, polyethylene, etc., or a combination thereof. In an embodiment, the organic encapsulation layer 320 may include acrylate.

In an embodiment, the first inorganic encapsulation layer 310 and the organic encapsulation layer 320 may extend to the transmission holes to be on the grooves 100Gv. In particular, the first inorganic encapsulation layer 310 may be arranged along the shapes of the grooves 100Gv in the transmission area TA. In detail, the first inorganic encapsulation layer 310 may be integrally provided along side and upper surfaces of the grooves 100Gv. Also, the organic encapsulation layer 320 may be on the first inorganic encapsulation layer 310. In detail, the organic encapsulation layer 320 may be filled inside the grooves 100Gv.

Referring to FIG. 2B, the display layer 200 may be covered by an encapsulation substrate 30B. Here, the encapsulation substrate 30B may face the substrate 100 with the display layer 200 therebetween. There may be a gap between the encapsulation substrate 30B and the display layer 200. The encapsulation substrate 30B may include glass. A sealant may be between the substrate 100 and the encapsulation substrate 30B, and the sealant may be in the non-display area NDA described above with reference to FIG. 1A or FIG. 1B. The sealant in the non-display area NDA may surround the display area DA to prevent moisture from infiltrating through side surfaces of the display area DA. Hereinafter, as shown in FIG. 2A, an example in which the display layer 200 may be covered by the thin film encapsulation layer 300 will be described below in detail.

The touch input layer 40 may obtain coordinate information according to an external input, e.g., a touch event. The touch input layer 40 may include a touch electrode and trace lines electrically connected to the touch electrode. The touch input layer 40 may sense an external input by a mutual capacitance method or a self-capacitance method.

The touch input layer 40 may be on the thin film encapsulation layer 300. As another example, the touch input layer 40 may be separately manufactured and may be coupled onto the thin film encapsulation layer 300 via an adhesive layer such as an optical clear adhesive (OCA). In an embodiment, the touch input layer 40 may be on (e.g., directly on) the thin film encapsulation layer 300 as shown in FIG. 2A, and the adhesive layer may not be between the touch input layer 40 and the thin film encapsulation layer 300.

The optical functional layer may include an anti-reflection layer. The anti-reflection layer may reduce a reflectivity of light (external light) incident to the display device 1 from outside.

In some embodiments, the anti-reflection layer may include an optical plate 50A including a retarder and/or a polarizer. The retarder may be of a film type or a liquid crystal coating type and may include a $\lambda/2$ retarder and/or a $\lambda/4$ retarder. The polarizer may be of a film type or a liquid crystal coating type. The film-type polarizer may include a stretched synthetic resin film, and the liquid crystal coating-type polarizer may include liquid crystals arranged in an orientation.

Referring to FIG. 2C, in some embodiments, the anti-reflection layer may include a filter plate 50B including a black matrix and color filters. The filter plate 50B may include a first layer 510, color filters 520 under the first layer 510, a black matrix 530, and an overcoat layer 540.

The color filters 520 may be arranged taking into account a color of light emitted from each of the pixels in the display device 1. For example, the color filter 520 may be red, green, or blue according to the color of light emitted from the organic light-emitting diode OLED. The transmission area TA may not include the color filters 520 and the black matrix 530. For example, a layer including the color filters 520 and the black matrix 530 may have a hole 5300P corresponding to the transmission area TA, and the overcoat layer 540 may be at least partially filled in the hole 5300P. The overcoat layer 540 may include an organic material such as a resin, and the organic material may be transparent. A structure of the filter plate 50B may be also applied to the display device 1 including the encapsulation substrate 30B shown in FIG. 2B.

In some embodiments, the anti-reflection layer may include a destructive interference structure. The destructive interference structure may include a first reflective layer and a second reflective layer arranged on different layers. First reflected light and second reflected light that may be respectively reflected by the first reflective layer and the second reflective layer may destructively interfere with each other, and accordingly, a reflectivity of external light may be reduced.

The component 20 may be in the component area CA. The component 20 may include an electronic element using light or sound. For example, the electronic element may include a sensor for measuring a distance such as a proximity sensor, a sensor for sensing a body part of a user (e.g., fingerprint, iris, face, etc.), a small-sized lamp outputting light, an image sensor for capturing an image (e.g., camera), etc. The electronic element using light may use light of various wavelength bands such as visible light, infrared rays, ultraviolet rays, etc. The electronic element using sound may use ultrasound waves or sound of another frequency band.

In some embodiments, the component 20 may include sub-components such as a light emitter and a light receiver. The light emitter and the light receiver may have an integrated structure or may have physically separated structure, and a pair of the light emitter and the light receiver may configure the component 20.

One or more components 20 may be in the component area CA. In an embodiment, when the display device 1 includes components 20, the display device 1 may include one component area CA. For example, the display device 1 may include the component area CA described above with reference to FIG. 1A. The components 20 may be separated from one another in an x-direction (in particular, x-direction of FIG. 1A) in the component area CA of a bar type. In some embodiments, when the display device 1 includes the components 20, the display device 1 may include component areas CA, and the number of which may correspond to that of the components 20. For example, the display device 1 may include component areas CA described above with reference to FIG. 1B, and the component areas CA may be apart from one another.

Figure 3:
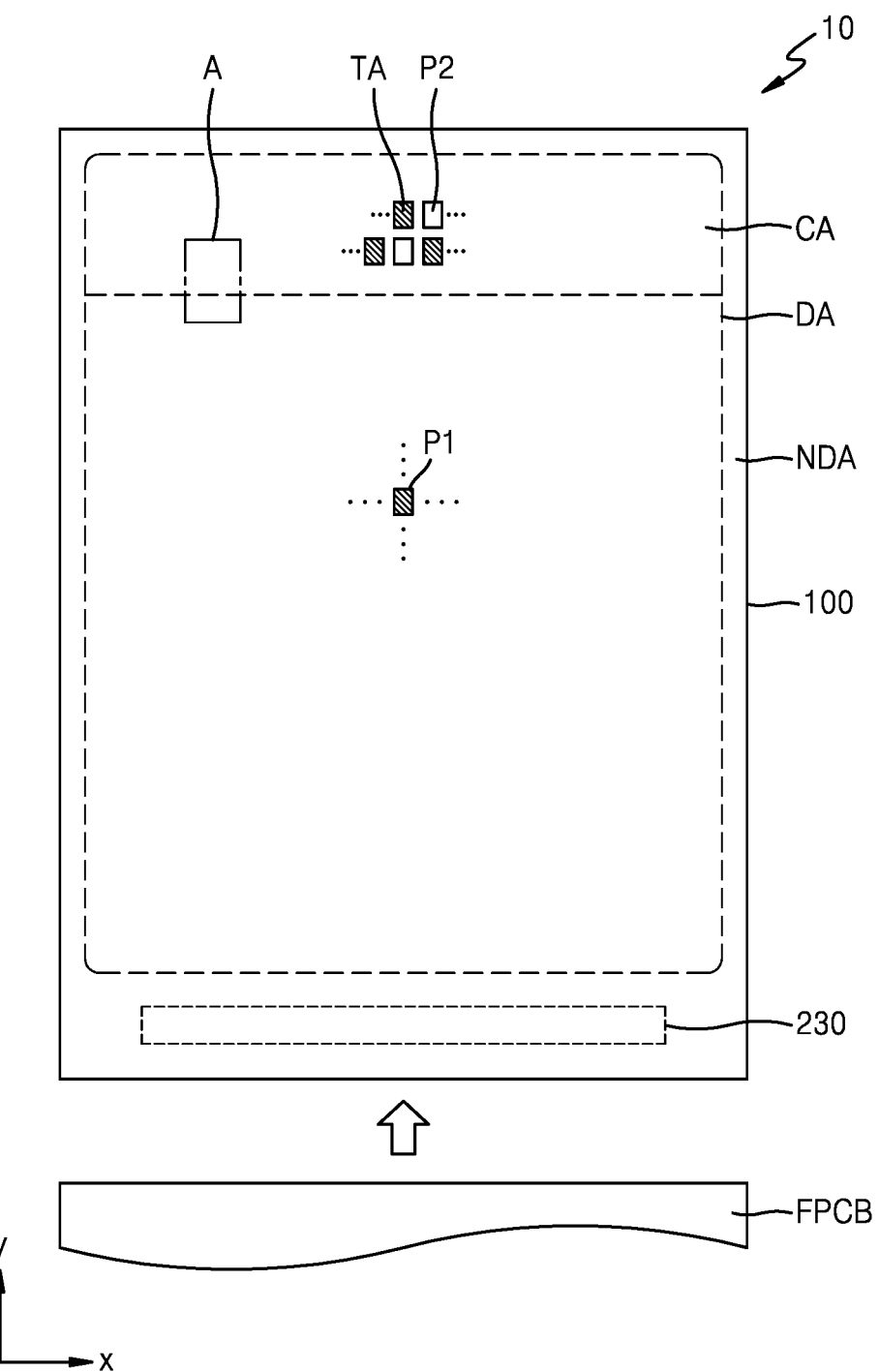
FIG. 3 is a schematic plan view of a display panel according to an embodiment.

FIG. 3 is a schematic plan view of a display panel 10 according to an embodiment.

The display panel 10 may include an array of pixels in the substrate 100. The pixels may include the first pixels P1 in the display area DA and the second pixels P2 in the component area CA.

In an embodiment, an area of the display area DA may be different from that of the component area CA. For example, the area of the display area DA may be greater than that of the component area CA.

The first pixels P1 may be two-dimensionally provided in the display area DA, and the second pixels P2 may be two-dimensionally provided in the component area CA. Also, the component area CA may include the transmission area TA. The transmission area TA may be between two neighboring second pixels P2.

The non-display area NDA may be adjacent to (e.g., entirely surround) the display area DA. A scan driver, a data driver, etc. may be in the non-display area NDA. A pad 230 may be in the non-display area NDA. The pad 230 may be adjacent to an edge of the substrate 100. The pad 230 may not be covered by an insulating layer, but may be exposed and electrically connected to a flexible printed circuit board FPCB. The flexible printed circuit board FPCB may electrically connect a controller to the pad 230 and may supply to the first pixels P1 and the second pixels P2 a signal or electric power transferred from the controller. In some embodiments, a data driver may be in the flexible printed circuit board FPCB. In order to transfer a signal or a voltage in the flexible printed circuit board FPCB to the first pixels P1 and the second pixels P2, the pad 230 may be electrically connected to lines.

In another embodiment, an integrated circuit IC may be on the pad 230, instead of the flexible printed circuit board FPCB. The integrated circuit IC may include, e.g., a data driver, and may be electrically connected to the pad 230 via an anisotropic conductive film including a conductive ball.

Each of the first pixels P1 and the second pixels P2 may emit certain color light by using an organic light-emitting diode OLED (see FIGS. 2A to 2C). Each of the organic light-emitting diodes OLED may emit, for example, red light, green light, or blue light. Each of the organic light-emitting diodes OLED may be electrically connected to the pixel circuit including a thin film transistor and a storage capacitor.

Figure 4:
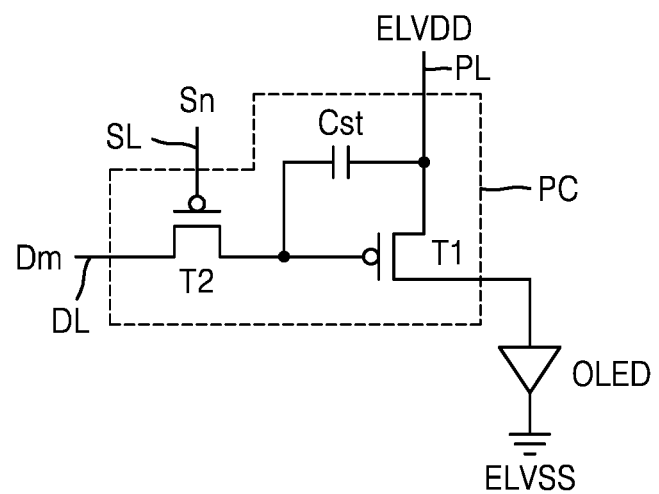
FIG. 4 is a schematic diagram of an equivalent circuit electrically connected to an organic light-emitting diode in a display device according to an embodiment.

FIG. 4 is a schematic diagram of an equivalent circuit electrically connected to an organic light-emitting diode in a display device according to an embodiment.

Referring to FIG. 4, the organic light-emitting diode OLED may be electrically connected to a pixel circuit PC. The pixel circuit PC may include a first thin film transistor T1, a second thin film transistor T2, and a storage capacitor Cst.

The second thin film transistor T2 may be a switching thin film transistor and may be electrically connected to a scan line SL and a data line DL, and may be configured to transfer a data voltage (or data signal Dm) input from the data line DL to the first thin film transistor T1 based on a switching voltage (or switching signal Sn) input from the scan line SL. The storage capacitor Cst may be electrically connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 may be a driving thin film transistor electrically connected to the driving voltage line PL and the storage capacitor Cst and may control a driving current flowing in the organic light-emitting diode OLED from the driving voltage line PL, corresponding to the voltage value stored in the storage capacitor Cst. The organic light-emitting diode OLED may emit light having a certain luminance according to the driving current. An opposite electrode (e.g., a cathode) of the organic light-emitting diode OLED may receive supply of a second power voltage ELVSS.

FIG. 4 shows that the pixel circuit PC may include two thin film transistors and one storage capacitor, but the number of thin film transistors and the number of storage capacitors may vary depending on a design of the pixel circuit PC. For example, the pixel circuit PC may include three or more thin film transistors.

Figure 5A:
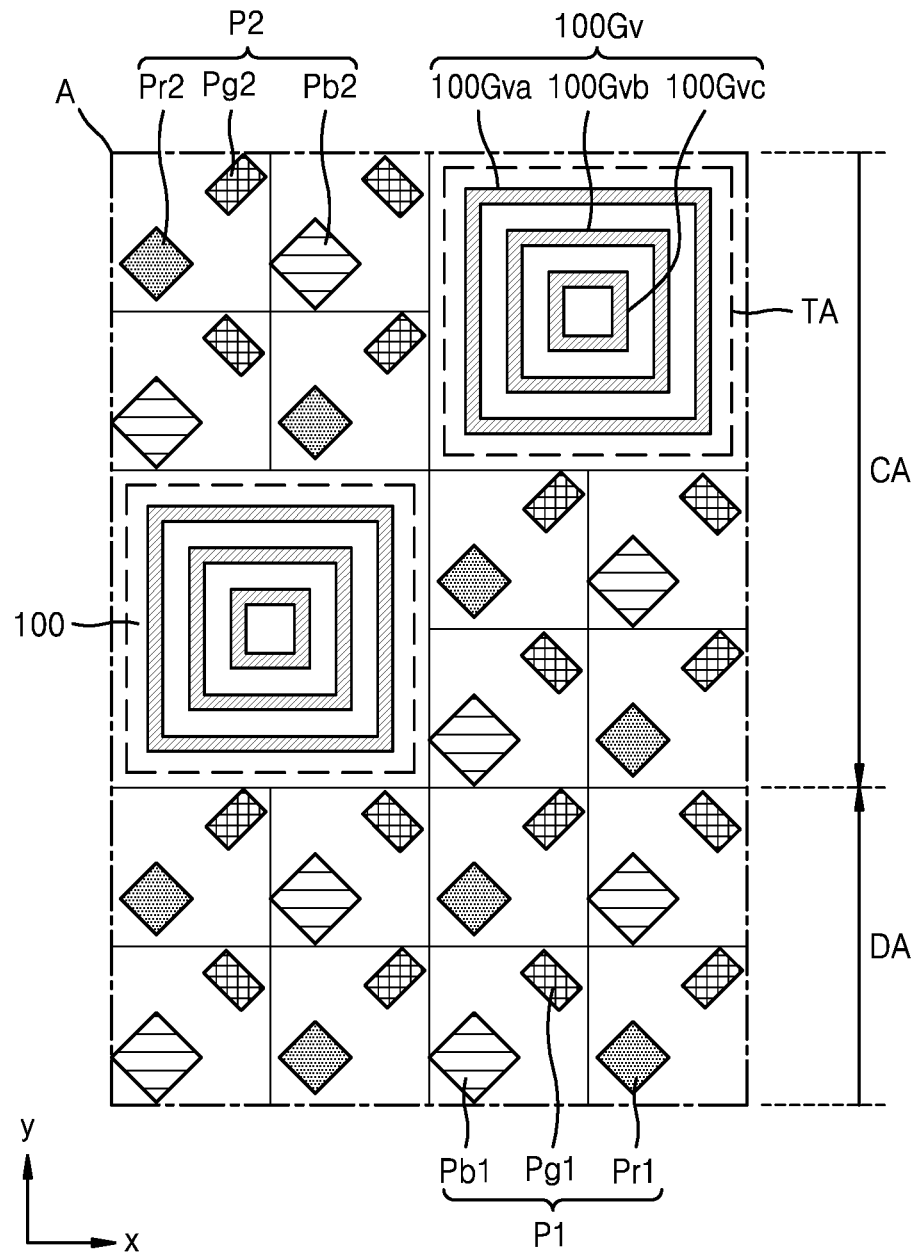
FIG. 5A is an enlarged schematic view of region A in FIG. 3.
Figure 5B:
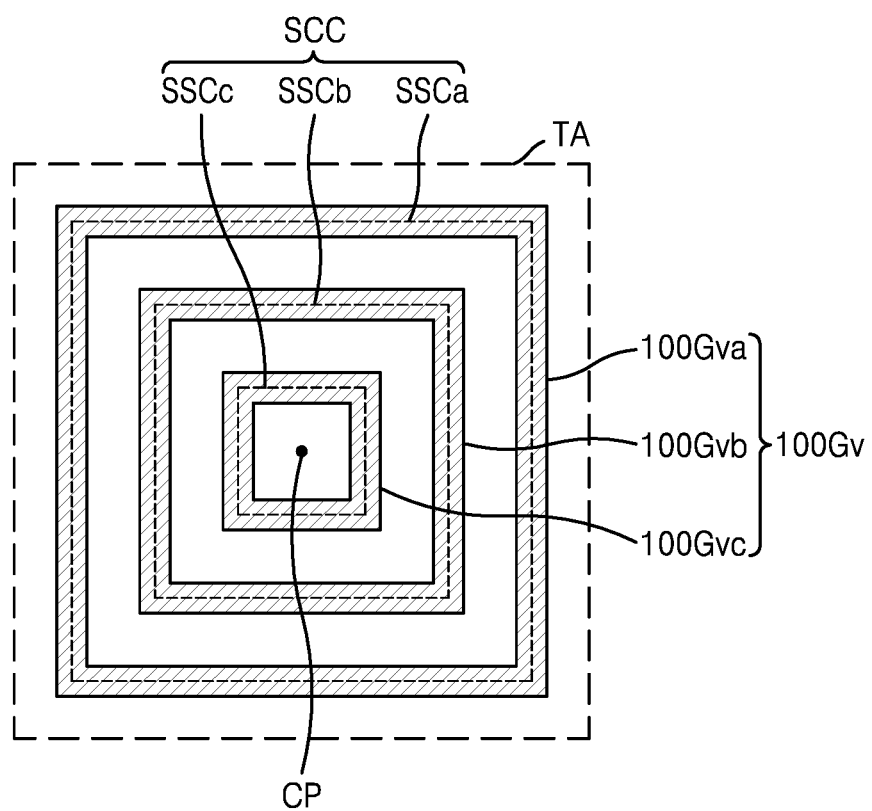
FIG. 5B is an enlarged schematic view of a transmission area.
Figure 5C:
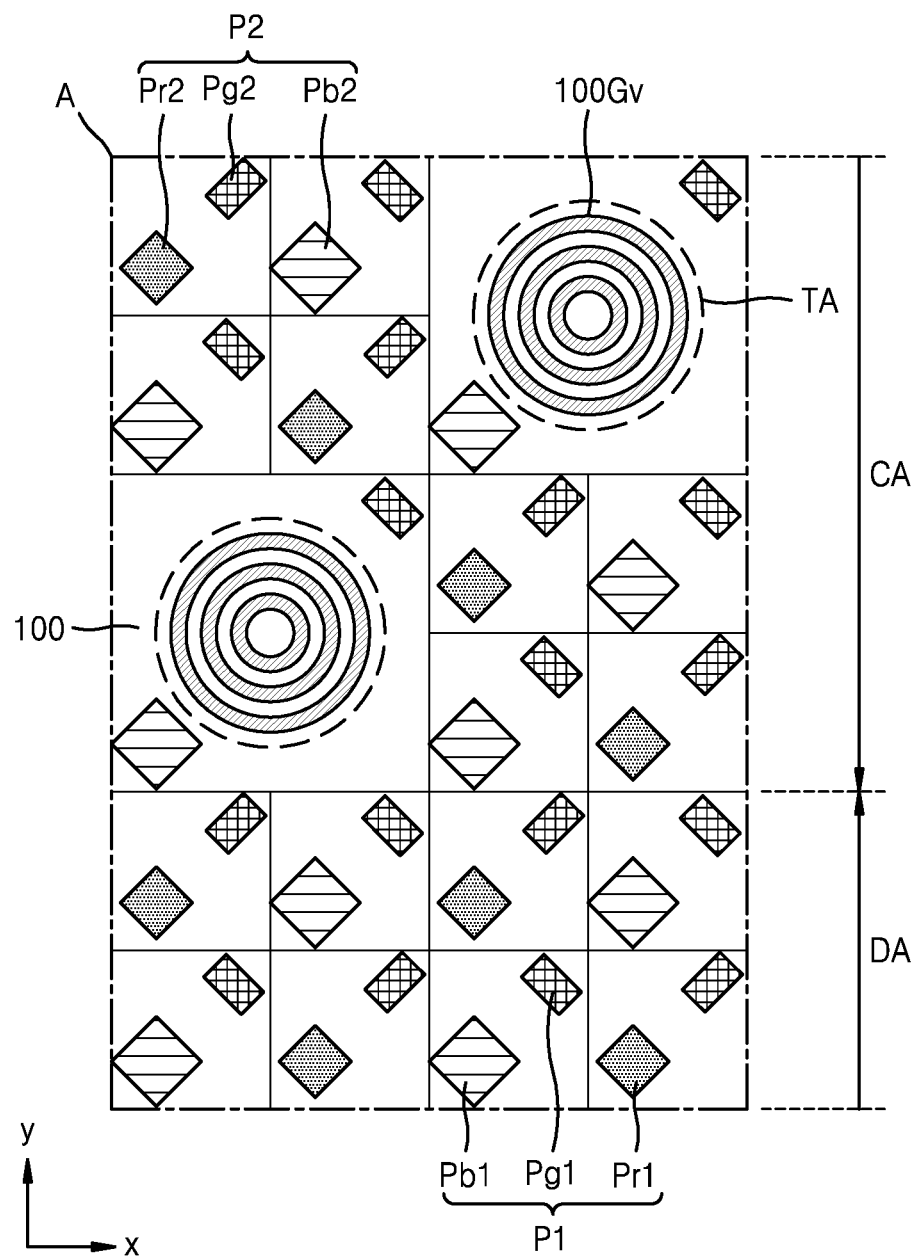
FIG. 5C is an enlarged schematic view of region A in FIG. 3 according to another embodiment.

FIG. 5A is an enlarged schematic view of region A in FIG. 3. FIG. 5B is an enlarged schematic view of the transmission area TA. FIG. 5C is an enlarged schematic view of region A in FIG. 3 according to another embodiment.

Referring to FIG. 5A and FIG. 5B, the display device may include the display area DA and the component area CA. The first pixels P1 may be in the display area DA. The component area CA may include the second pixels P2 and the transmission area TA.

The first pixels P1 may each include at least one sub-pixel emitting light. For example, each of the first pixels P1 may include a first red sub-pixel Pr1, a first green sub-pixel Pg1, or a first blue sub-pixel Pb1. In some embodiments, the first pixels P1 may further include a first white sub-pixel.

In an embodiment, the first red sub-pixel Pr1, the first green sub-pixel Pg1, and the first blue sub-pixel Pb1 may be arranged in a Pentile type. In another embodiment, the first red sub-pixel Pr1, the first green sub-pixel Pg1, and the first blue sub-pixel Pb1 may be arranged variously, for example, in a stripe type.

Similarly to the first pixels P1, the second pixels P2 may each include at least one sub-pixel emitting light. For example, each of the second pixels P2 may include a second red sub-pixel Pr2, a second green sub-pixel Pg2, or a second blue sub-pixel Pb2. Here, the second red sub-pixel Pr2, the second green sub-pixel Pg2, and the second blue sub-pixel Pb2 may be arranged in a Pentile type. In another embodiment, the second red sub-pixel Pr2, the second green sub-pixel Pg2, and the second blue sub-pixel Pb2 may be arranged variously, for example, in a stripe type.

The transmission area TA may be adjacent to the second pixels P2 in the component area CA. In detail, the transmission area TA may be adjacent to a group including the second red sub-pixel Pr2, the second green sub-pixel Pg2, and the second blue sub-pixel Pb2.

There may be transmission areas TA in the component area CA. Here, in an embodiment, the transmission areas TA may be provided to be shifted from one another.

In an embodiment, the substrate 100 may include grooves 100Gv corresponding to the transmission areas TA. For example, the grooves 100Gv may include a first groove 100Gva, a second groove 100Gvb, and a third groove 100Gvc. In another example, the grooves 100Gv may include a first groove 100Gva and a second groove 100Gvb. In another example, the grooves 100Gv may include four or more grooves. Hereinafter, in FIG. 5A, an example in which the grooves 100Gv include the first groove 100Gva, the second groove 100Gvb, and the third groove 100Gvc will be described below.

In an embodiment, the grooves 100Gv may each extend to form a closed line shape in the transmission area TA. For example, the grooves may each extend along a virtual single closed curve SCC in the transmission area TA. Here, the closed line shape (e.g., single closed curve SCC) may denote a closed figure having a starting point and an ending point that may be the same as each other, e.g., a polygon, a circle, or an ellipse. For example, the first groove 100Gva may extend to form a closed line shape (e.g., along a virtual first single closed curve SCCa). The second groove 100Gvb may extend to form a closed line shape (e.g., along a virtual second single closed curve SCCb). The third groove 100Gvc may extend to form a closed line shape (e.g., along a virtual third single closed curve SCCc).

In an embodiment, central points CP of the single closed curves SCC may be the same as one another. For example, the first single closed curve SCCa, the second single closed curve SCCb, and the third single closed curve SCCc may have the same central points CP. Here, the single closed curves SCC may be in a similarity relationship with each other.

In an embodiment, the first groove 100Gva may surround the second groove 100Gvb. Also, the second groove 100Gvb may surround the third groove 100Gvc.

Referring to FIG. 5A, the grooves 100Gv may have rectangular shapes. In detail, the first single closed curve SCCa may have a rectangular shape. Therefore, the first groove 100Gva may extend in a rectangular shape. Also, the second groove 100Gvb and the third groove 100Gvc may also extend in the rectangular shape. In particular, in some embodiments, the grooves 100Gv may have square shapes.

Referring to FIG. 5C, the grooves 100Gv may each have a curvature area. In detail, the grooves 100Gv may each have a circular shape or an elliptical shape. Here, the grooves 100Gv may be similar to one another.

In an embodiment, the grooves 100Gv may be provided to prevent the light from being diffracted while passing through the transmission area TA. In particular, in case that the grooves 100Gv may be in the similarity relationship, the diffraction occurring in the transmission area TA may be further reduced.

Figure 6:
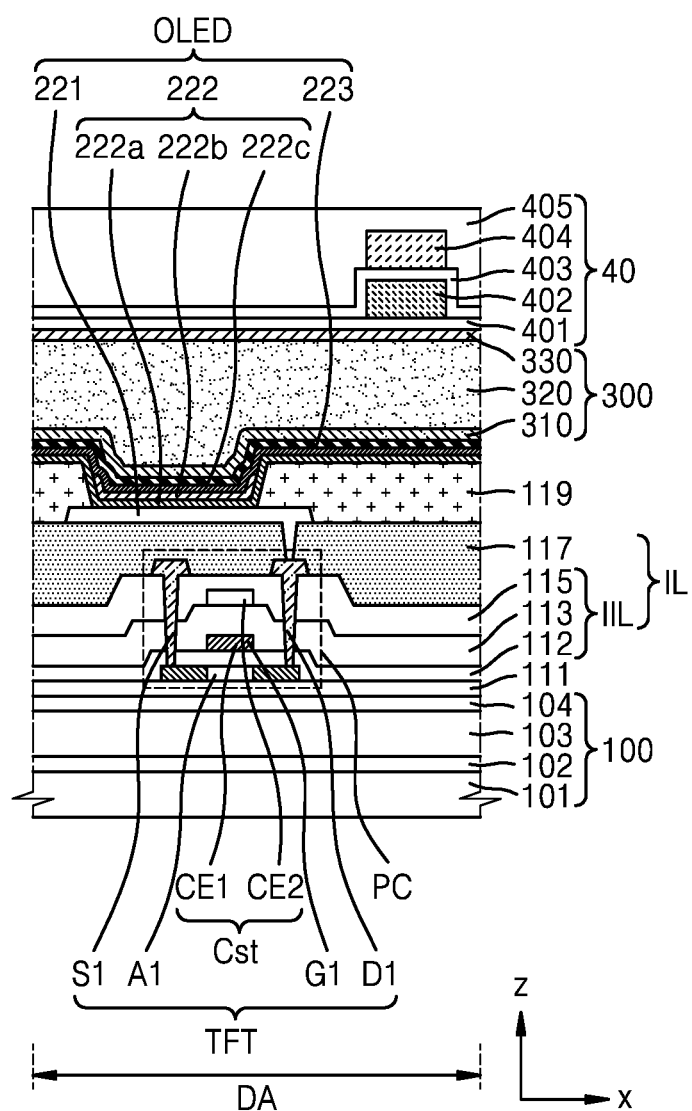
FIG. 6 is a schematic cross-sectional view partially showing a display device according to an embodiment.

FIG. 6 is a schematic cross-sectional view partially showing a display device according to an embodiment. Referring to FIG. 6, the display device may include the substrate 100, the buffer layer 111, the insulating layer IL, the organic light-emitting diode OLED, the thin film encapsulation layer 300, and the touch input layer 40. The insulating layer IL may include an inorganic insulating layer IL and a planarization layer 117.

In an embodiment, the substrate 100 may include a base layer including a polymer resin and a barrier layer including an inorganic insulating material. For example, the substrate 100 may include a first base layer 101, a first barrier layer 102, a second base layer 103, and a second barrier layer 104 that may be sequentially stacked on each other in the stated order. The first base layer 101 and the second base layer 103 may each include polyether sulfone, polyacrylate, polyether imide, polyethylene naphthalate, polyethylene terephthalate, polyphenylene sulfide, polyarylate, polyimide, polycarbonate, cellulose acetate propionate, etc. The first barrier layer 102 and the second barrier layer 104 may each include an inorganic insulating material such as silicon oxide, silicon oxynitride, and/or silicon nitride.

In an embodiment, the first base layer 101 may have a thickness of about 6 µm to about 10 µm. The second base layer 103 may have a thickness of about 5.8 µm to about 9 µm. Also, the first base layer 101 and the second base layer 103 may have a refractive index of about 1.5 to about 2.

The buffer layer 111 may be on the substrate 100. The buffer layer 111 may reduce or prevent infiltration of impurities, moisture, or external air from below the substrate 100. The buffer layer 111 may include an inorganic material such as an oxide material or a nitride material, an organic material, or an inorganic-organic composite material, and may have a single-layered or multi-layered structure including the inorganic material and the organic material.

The pixel circuit PC including the thin film transistor TFT and the storage capacitor Cst may be on the buffer layer 111. The thin film transistor TFT may include a semiconductor layer A1, a gate electrode G1 overlapping a channel region of the semiconductor layer A1, and a source electrode S1 and a drain electrode D1 respectively electrically connected to a source region and a drain region of the semiconductor layer µl. A gate insulating layer 112 may be between the semiconductor layer A1 and the gate electrode G1, and a first interlayer insulating layer 113 and a second interlayer insulating layer 115 may be between the gate electrode G1 and the source electrode S1 or between the gate electrode G1 and the drain electrode D1.

The storage capacitor Cst may overlap the thin film transistor TFT. The storage capacitor Cst may include a first capacitor plate CE1 and a second capacitor plate CE2 overlapping each other. In some embodiments, the gate electrode G1 of the thin film transistor TFT may include the first capacitor plate CE1 of the storage capacitor Cst. The first interlayer insulating layer 113 may be between the first capacitor plate CE1 and the second capacitor plate CE2.

The semiconductor layer A1 may include polysilicon. In some embodiments, the semiconductor layer A1 may include amorphous silicon. In some embodiments, the semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The semiconductor layer A1 may include a channel region, and a source region and a drain region doped with impurities.

The gate insulating layer 112 may include an inorganic insulating material such as silicon oxide, silicon oxynitride, and silicon nitride, and may have a single-layered or multi-layered structure including the stated materials.

The gate electrode G1 or the first capacitor plate CE1 may have a single-layered or multi-layered structure including a low-resistive conductive material such as molybdenum (Mo), aluminum (Al), copper (Cu), and/or titanium (Ti).

The first interlayer insulating layer 113 may include an inorganic insulating material such as silicon oxide, silicon oxynitride, and silicon nitride, and may have a single-layered or multi-layered structure including the stated materials.

The second capacitor plate CE2 may have a single-layered or multi-layered structure including aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and/or copper (Cu).

The second interlayer insulating layer 115 may include an inorganic insulating material such as silicon oxide, silicon oxynitride, and silicon nitride, and may have a single-layered or multi-layered structure including the stated materials.

The source electrode S1 or the drain electrode D1 may have a single-layered or multi-layered structure including aluminum (Al), platinum (Pt), palladium (Pd), argentum (Ag), magnesium (Mg), aurum (Au), neodymium (Nd), iridium (Ir), chromium (Cr), nickel (Ni), lithium (Li), calcium (Ca), molybdenum (Mo), titanium (Ti), tungsten (W), and/or copper (Cu). For example, the source electrode S1 or the drain electrode D1 may have a triple-layered structure including titanium layer/aluminum layer/titanium layer.

The planarization layer 117 may include a material different from that of at least one inorganic insulating layer IL located thereunder, e.g., the gate insulating layer 112, the first interlayer insulating layer 113, and the second interlayer insulating layer 115. The planarization layer 117 may include an organic insulating material. The planarization layer 117 may include an organic insulating material such as acryl, benzocyclobutene (BCB), polyimide, hexamethyldisiloxane (HMDSO), etc., or a combination thereof. The organic insulating material of the planarization layer 117 may be a photosensitive organic insulating material.

A pixel electrode 221 may be on the planarization layer 117. The pixel electrode 221 may be electrically connected to the thin film transistor TFT via a contact hole in the planarization layer 117.

The pixel electrode 221 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. The pixel electrode 221 may include a reflective layer including the above-stated material, and a transparent conductive layer on and/or under the reflective layer. The transparent conductive layer may include indium tin oxide (ITO), indium zinc oxide (IZO), zinc oxide (ZnO), indium oxide ($In_2O_3$), indium gallium oxide, or aluminum zinc oxide (AZO), or a combination thereof. In an embodiment, the pixel electrode 221 may have a triple-layered structure including ITO layer/Ag layer/ITO layer that may be stacked on each other sequentially.

A pixel defining layer 119 may be on the pixel electrode 221. The pixel defining layer 119 may cover edges of the pixel electrode 221 and may include an opening 1190P overlapping a central portion of the pixel electrode 221. The pixel defining layer 119 may include an organic insulating material and/or an inorganic insulating material. The opening 1190P may define an emission area of the light emitted from the organic light-emitting diode OLED. In the specification, the emission area of the light denotes a size of a sub-pixel.

The intermediate layer 222 may include an emission layer 222b overlapping the pixel electrode 221. The emission layer 222b may include an organic material. The emission layer 222b may include a polymer and/or low-molecular weight organic material emitting certain color light. The emission layer 222b may be obtained through a deposition process using a mask.

A first functional layer 222a and a second functional layer 222c may be under and/or on the emission layer 222b.

The first functional layer 222a may have a single-layered or multi-layered structure. For example, in case that the first functional layer 222a includes a polymer material, the first functional layer 222a may include a hole transport layer (HTL) having a single-layered structure, and may include poly-(3,4)-ethylene-dihydroxy thiophene (PEDOT) and/or polyaniline. In case that the first functional layer 222a includes a low-molecular weight material, the first functional layer 222a may include a hole injection layer (HIL) and an HTL.

The second functional layer 222c may be optional. For example, in case that the first functional layer 222a and the emission layer 222b include a polymer material, the second functional layer 222c may be formed. The second functional layer 222c may have a single-layered or multi-layered structure. The second functional layer 222c may include an electron transport layer (ETL) and/or an electron injection layer (EIL).

Each of the first functional layer 222a and the second functional layer 222c may be integrally provided to entirely cover the display area DA and the component area CA that will be described later with reference to FIG. 7.

The opposite electrode 223 may include a conductive material having a relatively low work function. For example, the opposite electrode 223 may include a (semi-)transparent layer including argentum (Ag), magnesium (Mg), aluminum (Al), nickel (Ni), chromium (Cr), lithium (Li), calcium (Ca), or an alloy thereof. As another example, the opposite electrode 223 may further include a layer including ITO, IZO, ZnO, or $In_2O_3$ on the (semi-)transparent layer including the above material. In an embodiment, the opposite electrode 223 may include argentum (Ag) and magnesium (Mg).

A stack structure of the pixel electrode 221, the intermediate layer 222, and the opposite electrode 223 that may be sequentially stacked on each other may configure a light-emitting diode, e.g., an organic light-emitting diode OLED. The organic light-emitting diode OLED may be covered by the thin film encapsulation layer 300.

The thin film encapsulation layer 300 may include first and second inorganic encapsulation layers 310 and 330, and an organic encapsulation layer 320 between the first and second inorganic encapsulation layers 310 and 330.

The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first and second inorganic encapsulation layers 310 and 330 may be obtained by a chemical vapor deposition method. Here, the first and second inorganic encapsulation layers 310 and 330 may each have a thickness of about 1 μm to about 1.3 μm. A refractive index of the first and second inorganic encapsulation layers 310 and 330 may be about 1.75 to about 1.85.

The organic encapsulation layer 320 may include a polymer-based material. The polymer-based material may include an acryl-based resin, an epoxy-based resin, polyimide, polyethylene, etc., or a combination thereof. For example, the organic encapsulation layer 320 may include an acryl-based resin, e.g., polymethylmethacrylate, polyacrylic acid, etc. The organic encapsulation layer 320 may be obtained by curing a monomer or applying polymer. The organic encapsulation layer 320 including the acryl-based resin may have a refractive index of about 1.49 or less. The organic encapsulation layer 320 including an epoxy-based resin may have a refractive index of about 1.57 to about 1.61.

The touch input layer 40 may be on the second inorganic encapsulation layer 320, and may include at least one inorganic layer and a sensing electrode.

In the touch input layer 40, an insulating layer and a conductive layer may be alternately laminated. In an embodiment, the touch input layer 40 may include a first insulating layer 401, a first conductive layer 402, a second insulating layer 403, a second conductive layer 404, and a third insulating layer 405. The first conductive layer 402 and the second conductive layer 404 may be connected to each other via a contact hole (not shown). The sensing electrode may be included in at least one of the first conductive layer 402 and the second conductive layer 404.

The first conductive layer 402 or the second conductive layer 404 may include a metal layer or a transparent conductive layer. The metal layer may include molybdenum (Mo), mendelebium (Mb), argentum (Ag), titanium (Ti), copper (Cu), aluminum (Al), and an alloy thereof. The transparent conductive layer may include a transparent conductive oxide material such as indium tin oxide (ITO), indium zinc oxide (IZO), zinc oxide (ZnO), indium tin zinc oxide (ITZO), etc., or a combination thereof. The transparent conductive layer may include a conductive polymer such as PEDOT, metal nano-wires, graphene, etc., or a combination thereof.

The first conductive layer 402 or the second conductive layer 404 may have a single-layered or multi-layered structure. The first conductive layer 402 or the second conductive layer 404 of the single-layered structure may include a metal layer or a transparent conductive layer, and the metal layer and the transparent conductive layer may include the above stated materials. One of the first conductive layer 402 and the second conductive layer 404 may include a single metal layer. One of the first conductive layer 402 and the second conductive layer 404 may include a multi-layered metal layer. The multi-layered metal layer may include, for example, triple layers including titanium layer/aluminum layer/titanium layer, or double layers including molybdenum layer/mendelebium layer. As another example, the multi-layered metal layer may include a metal layer and a transparent conductive layer. The first conductive layer 402 and the second conductive layer 404 may have the stack structures that are the same as or different from each other. For example, the first conductive layer 402 may include a metal layer, and the second conductive layer 404 may include a transparent conductive layer. As another example, the first conductive layer 402 and the second conductive layer 404 may include a same metal layer.

The materials included in the first conductive layer 402 and the second conductive layer 404 and the arrangement of sensing electrodes included in the first conductive layer 402 and the second conductive layer 404 may be determined according to a sensitivity. An RC delay may affect the sensitivity, and sensing electrodes including the metal layer may have less resistance as compared with the transparent conductive layer, and thus, an RC value may be reduced. Therefore, a time taken to charge a capacitor defined between the sensing electrodes may be reduced. The sensing electrodes including the transparent conductive layers may not be visible by a user as compared with the metal layer, and an input area may be increased to increase a capacitance.

Each of the first insulating layer 401, the second insulating layer 403, and the third insulating layer 405 may include an inorganic insulating material and/or an organic insulating material. The inorganic insulating material may include silicon oxide, silicon nitride, or silicon oxynitride, and the organic insulating material may include a polymer organic material. In some embodiments, the first insulating layer 401 may be omitted.

Figure 7:
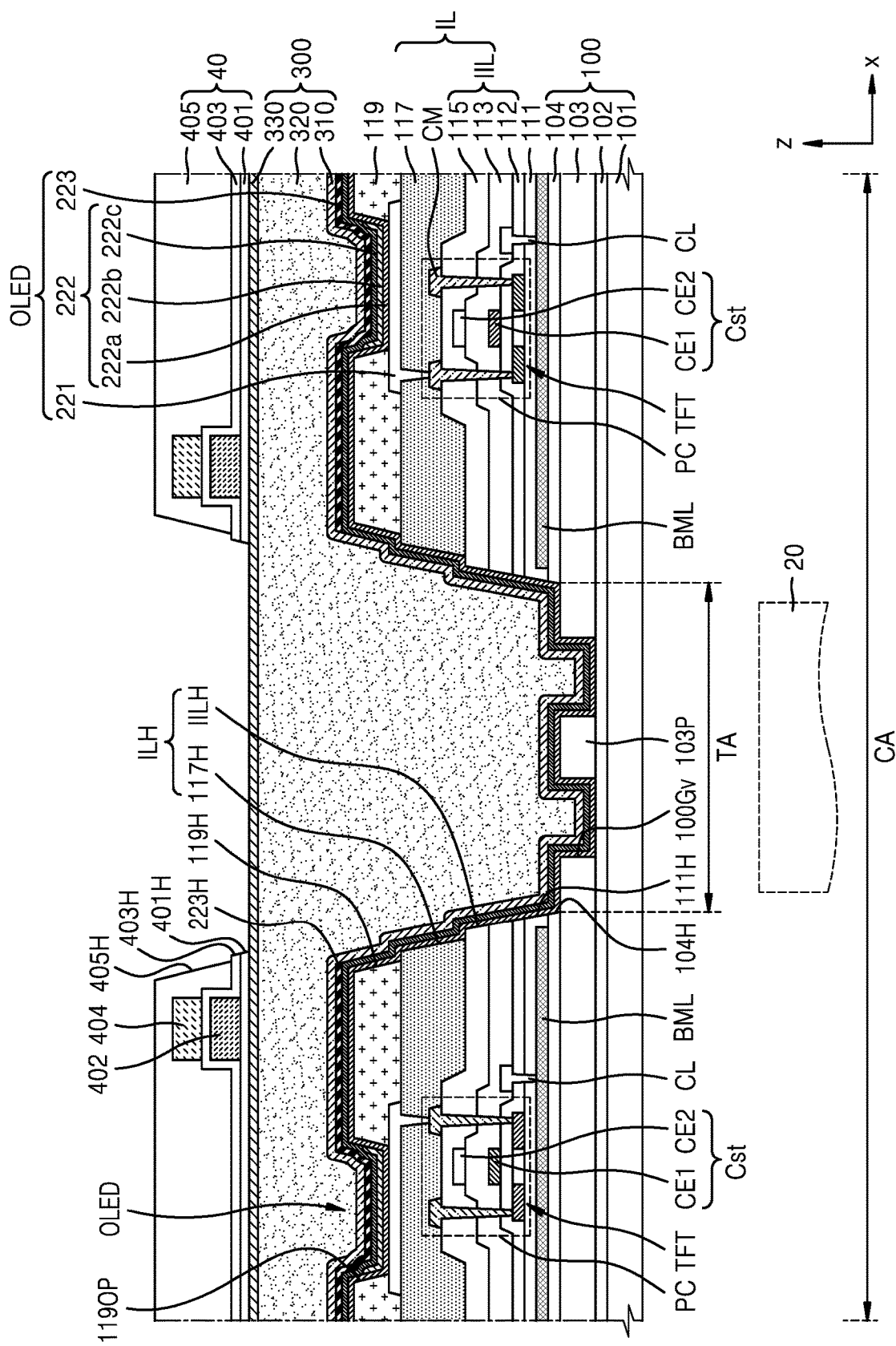
FIG. 7 is a schematic cross-sectional view of a component area according to an embodiment.
Figure 8:
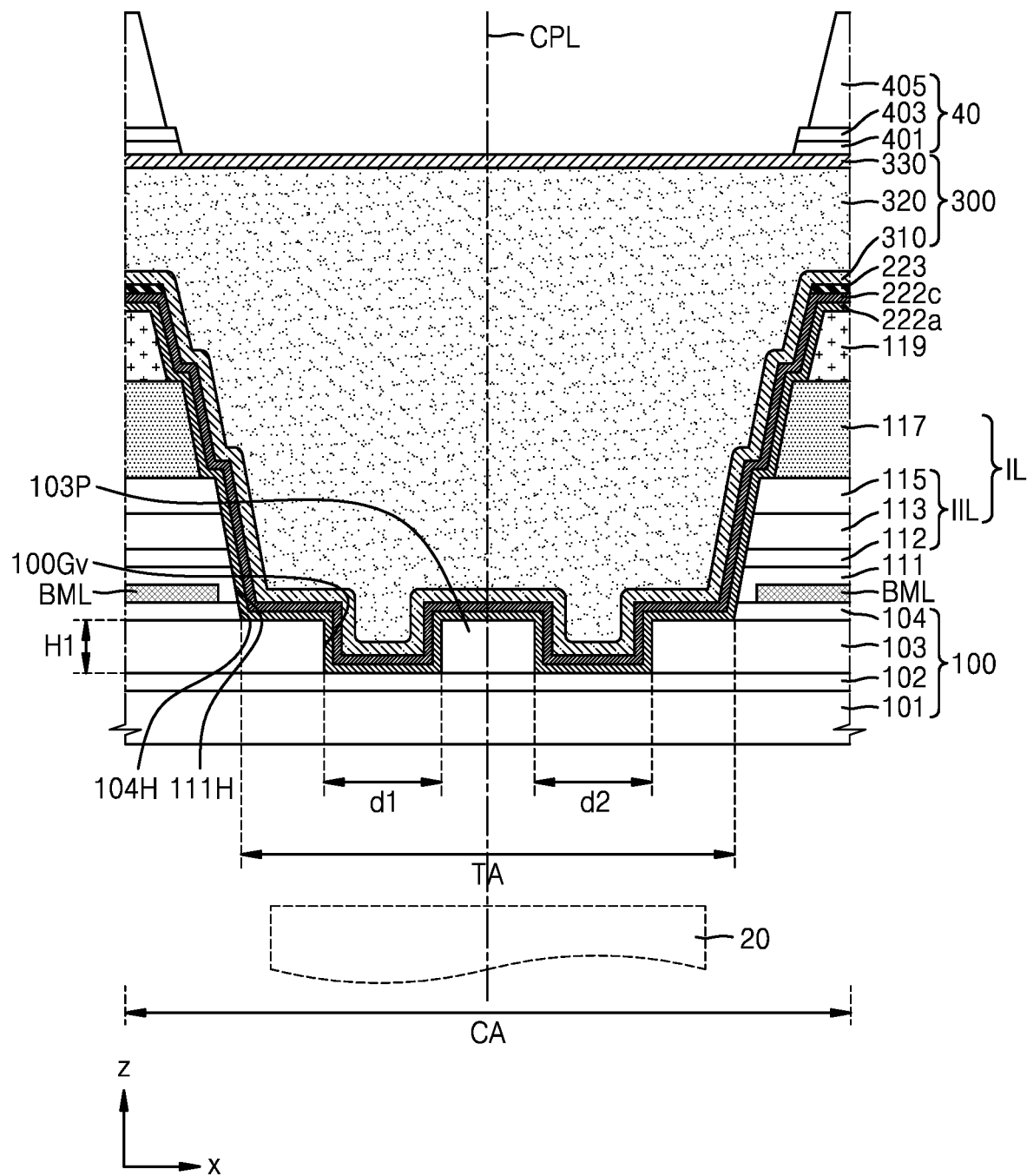
FIG. 8 is a schematic cross-sectional view showing an enlarged view of a transmission area according to an embodiment.

FIG. 7 is a schematic cross-sectional view of a component area CA according to an embodiment. FIG. 8 is a schematic cross-sectional view showing an enlarged view of the transmission area TA according to an embodiment.

Referring to FIGS. 7 and 8, the component area CA may include the transmission area TA. Two pixel circuits PC and two organic light-emitting diodes OLED may be adjacent to each other with the transmission area TA therebetween. The organic light-emitting diodes OLED may be electrically connected respectively to the pixel circuits PC. The organic light-emitting diode OLED described above with reference to FIG. 6 may correspond to a first display element in the display area DA, and an organic light-emitting diode OLED shown in FIG. 7 may correspond to a second display element in the component area CA.

The structure of the organic light-emitting diode OLED, and the structure of the pixel circuit PC including the thin film transistor TFT and the storage capacitor Cst shown in FIG. 7 may be substantially the same as those described above with reference to FIG. 6. Therefore, the detailed structure of the organic light-emitting diode OLED and the structures of the thin film transistor TFT and the storage capacitor Cst are not described, but differences from the above embodiment will be described below.

The component 20 may be under the substrate 100. In particular, the component 20 may correspond to the transmission area TA.

The lower metal layer BML may be between the substrate 100 and the buffer layer 111. The lower metal layer BML may be under the thin film transistor TFT to prevent degradation in characteristics of the thin film transistor TFT due to the light emitted from the component 20, etc.

Also, the lower metal layer BML may be electrically connected to line CL that may be in another layer via a contact hole. The lower metal layer BML may receive a constant voltage or a signal from the line CL. For example, the lower metal layer BML may receive a driving voltage or a scan signal. Because the lower metal layer BML may be provided with the constant voltage or signal, a probability of generating an electrostatic discharge may be noticeably reduced. The lower metal layer BML may include aluminum (Al), platinum (Pt), palladium (Pd), argentum (Ag), magnesium (Mg), aurum (Au), neodymium (Nd), iridium (Ir), chromium (Cr), nickel (Ni), calcium (Ca), molybdenum (Mo), titanium (Ti), tungsten (W), and/or copper (Cu), or a combination thereof. The lower metal layer BML may have a single-layered or a multi-layered structure including the above stated materials.

In an embodiment, the second barrier layer 104 may include a first transmission hole 104H. The first transmission hole 104H may correspond to the transmission area TA. The insulating layer IL between the substrate 100 and the organic light-emitting diode OLED may include a second transmission hole ILH corresponding to the transmission area TA. Also, the buffer layer 111 between the insulating layer IL and the substrate 100 may include a third transmission hole 111H.

In an embodiment, the second transmission hole ILH may include a first hole IILH of the inorganic insulating layer IL and a second hole 117H of the planarization layer 117. Also, the pixel defining layer 119 may include a third hole 119H. The first hole IILH, the second hole 117H, and the third hole 119H may overlap one another in the transmission area TA. The opposite electrode 223 may also include a fourth hole 223H in the transmission area TA, and the fourth hole 223H may overlap the first hole IILH, the second hole 117H, and the third hole 119H.

Some of the intermediate layer 222 in the organic light-emitting diode OLED, e.g., the first functional layer 222a and/or the second functional layer 222c, may be integrally provided to cover the transmission area TA. As another example, the first functional layer 222a and/or the second functional layer 222c may include a hole corresponding to the transmission area TA, similarly to the opposite electrode 223.

The thin film encapsulation layer 300 may entirely cover the display area DA and the component area CA. Therefore, the first inorganic encapsulation layer 310, the organic encapsulation layer 320, and the second inorganic encapsulation layer 330 may cover the transmission area TA.

In an embodiment, the first insulating layer 401, the second insulating layer 403, and the third insulating layer 405 of the touch input layer 40 may each include a transmission hole corresponding to the transmission area TA. Here, a fifth hole 401H of the first insulating layer 401, a sixth hole 403H of the second insulating layer 403, and a seventh hole 405H of the third insulating layer 405 may overlap the first hole IILH, the second hole 117H, and the third hole 119H.

In an embodiment, the substrate 100 may include grooves 100Gv corresponding to the transmission area TA. In particular, in an embodiment, the grooves 100Gv may be symmetrically provided about a central line CPL that may be perpendicular to an upper surface of the substrate 100.

In an embodiment, the grooves 100Gv may be in the base layer to be connected to the first transmission hole 104H. For example, the second barrier layer 104 may include the first transmission hole 104H corresponding to the transmission area TA, and the grooves 100Gv may be in the second base layer 103 to be connected to the first transmission hole 104H.

In an embodiment, a depth of the grooves 100Gv may be substantially same as a thickness of the base layer. For example, the grooves 100Gv may have a depth that may be substantially same as a thickness H1 of the second base layer 103. Lower surfaces in the grooves 100Gv may be the upper surface of the first barrier layer 102. For example, the grooves 100Gv may be the through holes penetrating through the second base layer 103. In some embodiments, the grooves 100Gv may have a depth that may be different from the thickness of the base layer. However, the case in which the depths of the grooves 100Gv may be substantially same as the thickness of the base layer will be described in detail for convenience of description.

In an embodiment, a width of one of the grooves 100Gv may be substantially same as a width of another one of the grooves. For example, a first width d1 of one of the grooves 100Gv may be substantially same as a second width d2 of another one of the grooves 100Gv.

In an embodiment, the first inorganic encapsulation layer 310 and the organic encapsulation layer 320 may extend to the second transmission hole ILH to be on the grooves 100Gv. In detail, the first inorganic encapsulation layer 310 and the organic encapsulation layer 320 may extend to the first transmission hole 104H, the second transmission hole ILH, and the third transmission hole 111H.

In an embodiment, the first inorganic encapsulation layer 310 may be provided according to the shapes of the grooves 100Gv. In detail, the first inorganic encapsulation layer 310 may be arranged along side and upper surfaces of the grooves 100Gv. Also, the organic encapsulation layer 320 may extend to the second transmission hole ILH to be in the grooves 100Gv. In detail, the organic encapsulation layer 320 may be filled inside the grooves 100Gv.

In an embodiment, diffraction of light proceeding from the thin film encapsulation layer 300 to the component 20 in a direction towards the substrate 100 or light proceeding from the component 20 towards the substrate 100 may be prevented. In case that the grooves 100Gv are not in the substrate 100, the transmission area TA may function as one single slit. Therefore, there may be light loss due to the diffraction. However, as in an embodiment, in case that there are the grooves 100Gv in the substrate 100, the grooves 100Gv may function similarly to multiple slits by adjusting a phase difference of the light. Therefore, the light loss caused by the diffraction may be reduced, and signal or image distortion caused by the diffraction may be reduced. Also, the second base layer 103 may be partially removed in the transmission area TA, and thus, an accumulative transmittance may be improved.

For example, a phase difference between first light passing through the grooves 100Gv from an upper surface of the first barrier layer 102 and second light passing through a protrusion 103P between the grooves 100Gv from the upper surface of the first barrier layer 102 may depend on a refractive index of the organic encapsulation layer 320, a refractive index of the second base layer 103, and a thickness H1 of the second base layer 103. In particular, a path difference when the first light and the second light respectively pass through the grooves 100Gv and the protrusion 103P may be determined by multiplying a difference between the refractive index of the organic encapsulation layer 320 and the refractive index of the second base layer 103 by the thickness H1 of the second base layer 103. Here, the refractive index of the organic encapsulation layer 320 may be about 1.49 in case of including the acryl-based resin, and about 1.57 to about 1.61 in case of including the epoxy-based resin. The refractive index of the second base layer 103 may be about 1.5 to about 2. The thickness H1 of the second base layer 103 may be about 5.8 μm to about 9 μm. In an embodiment, the first light and the second light may be adjusted to have a phase difference to make the first light and the second light constructively interfere with each other. Therefore, the diffraction may be reduced.

Figure 9A:
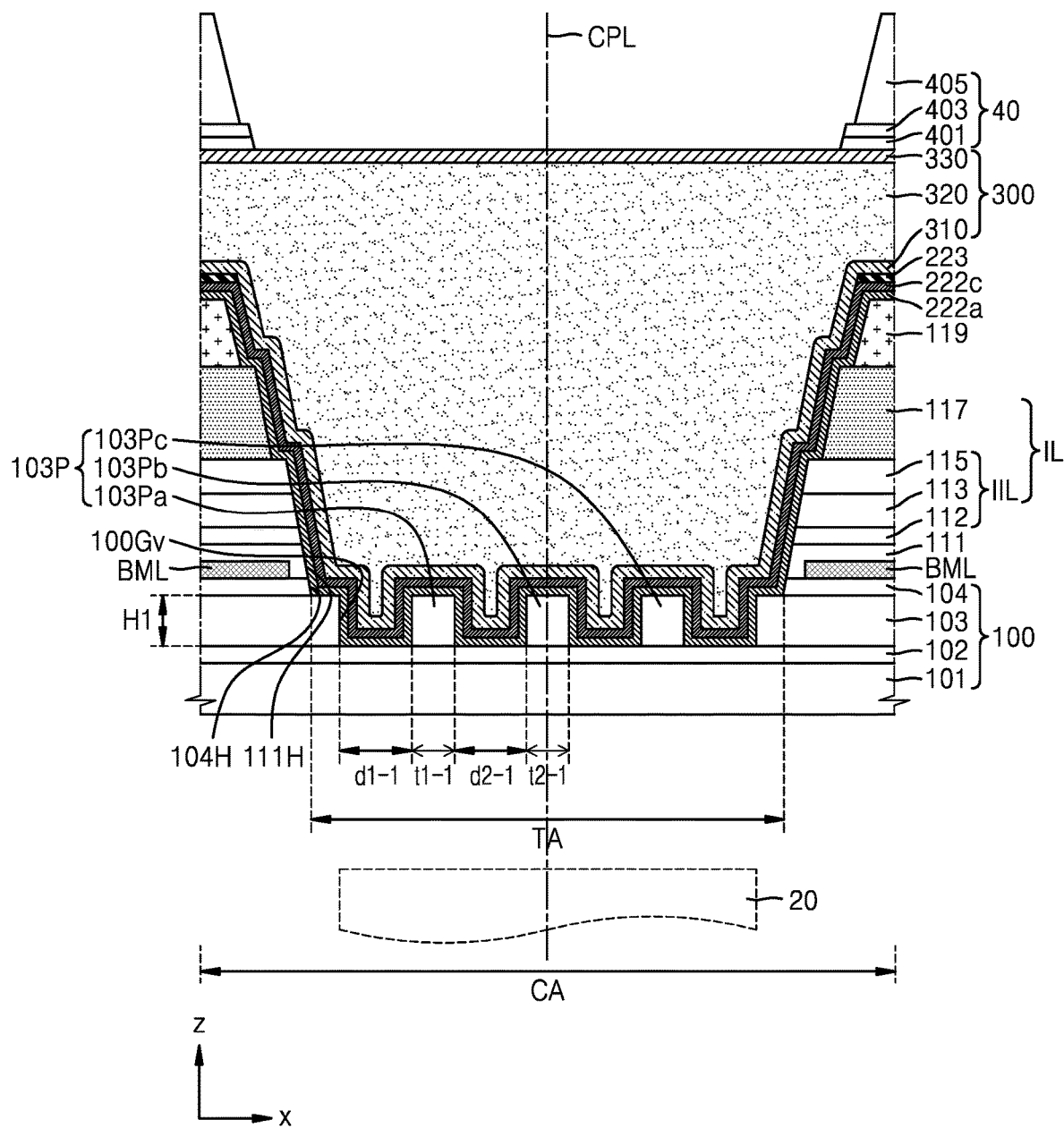
FIGS. 9A to 9C are schematic cross-sectional views showing an enlarged view of a transmission area according to another embodiment.
Figure 9B:
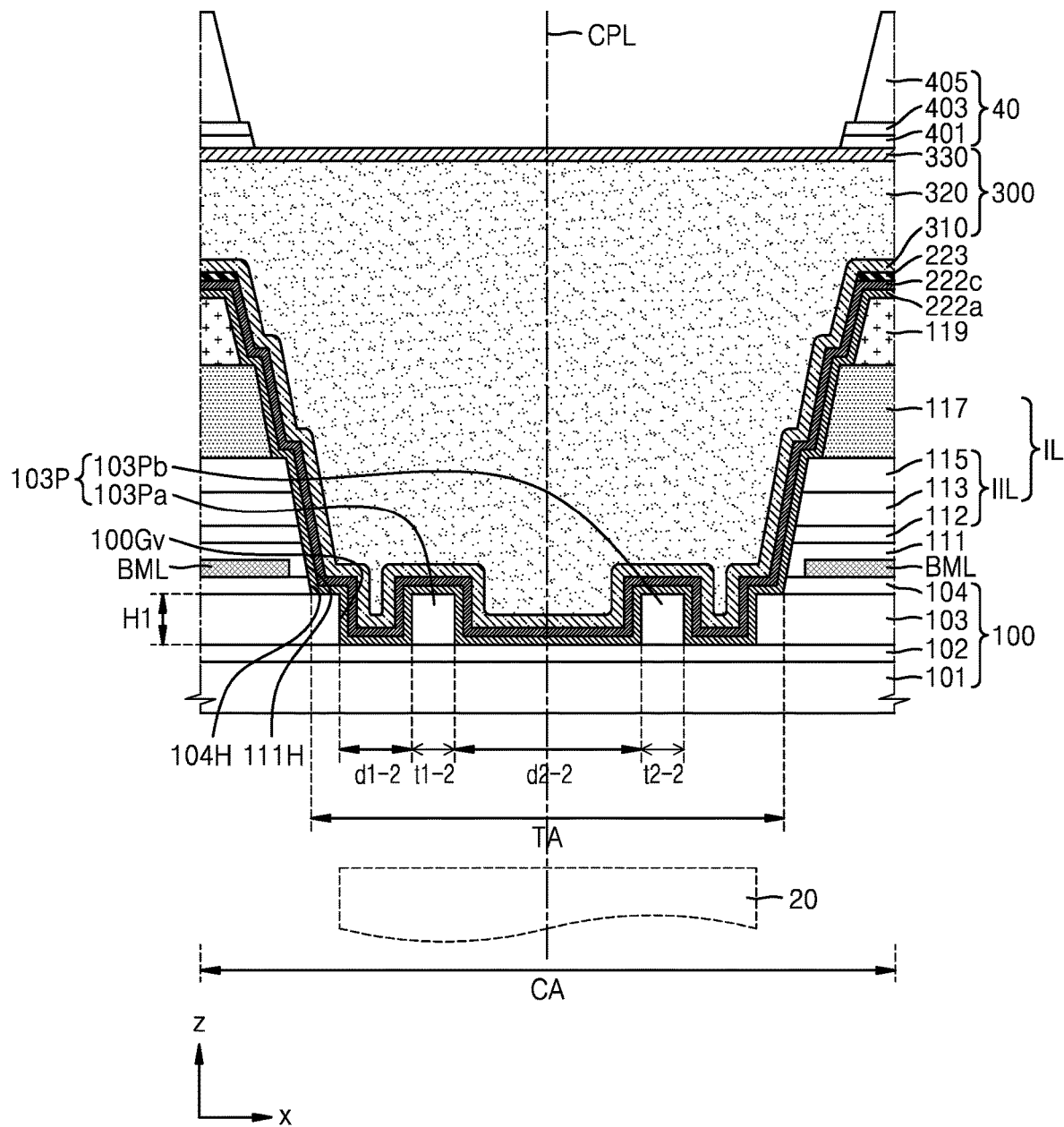
Figure 9C:
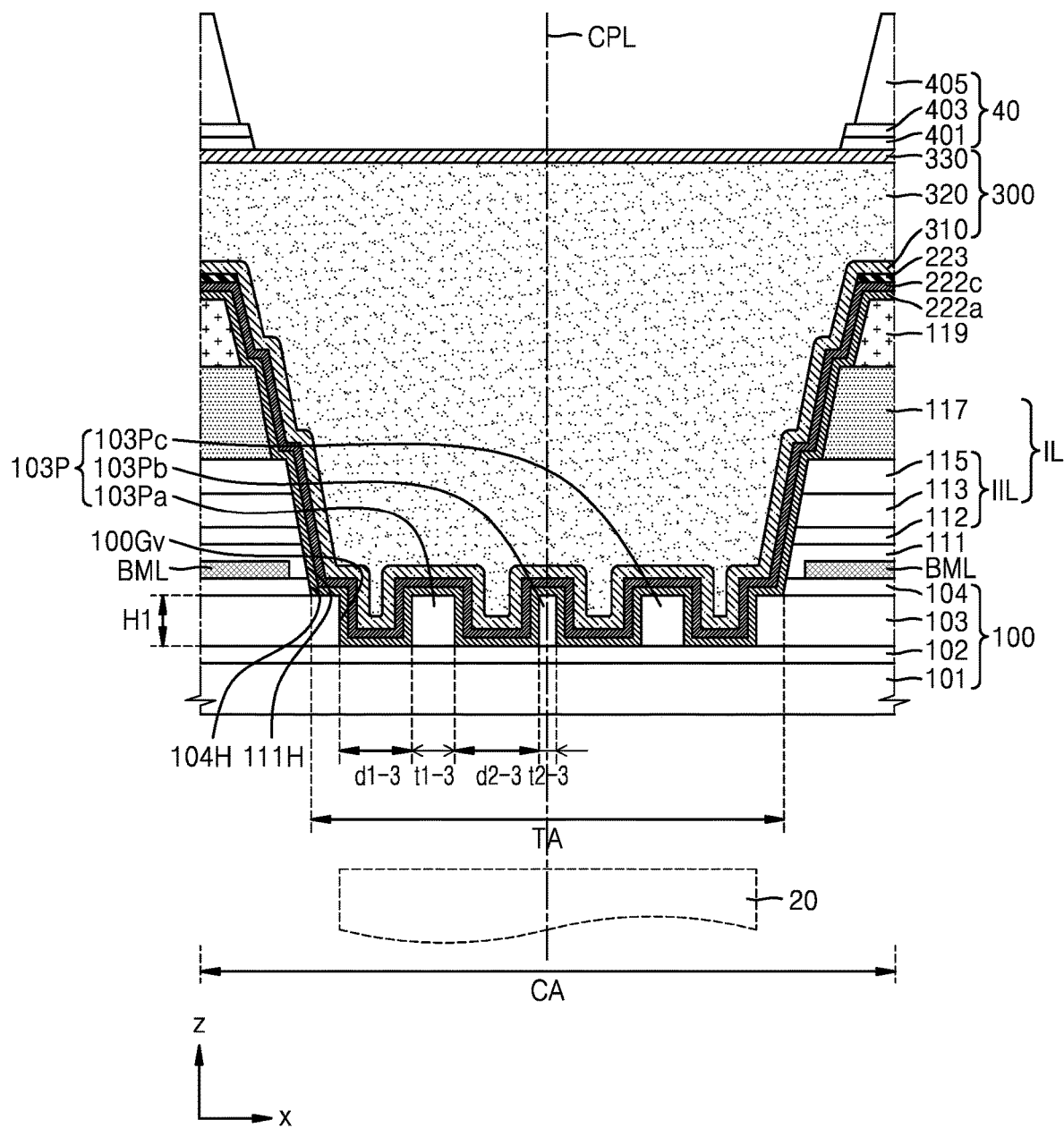

FIGS. 9A to 9C are schematic cross-sectional views showing an enlarged view of a transmission area TA according to another embodiment. In FIGS. 9A to 9C, like reference numerals as those of FIG. 8 denote the same members, and thus, descriptions thereof are omitted.

Referring to FIGS. 9A to 9C, the display device may include the substrate 100 including a display area and the component area CA in which the transmission area TA may be provided. Here, the substrate 100 may include grooves 100Gv corresponding to the transmission area TA.

Referring to FIG. 9A, four grooves 100Gv may be in the transmission area TA. As described above, the number of grooves 100Gv may vary.

In an embodiment, the grooves 100Gv may be symmetrically provided about a central line CPL that may be perpendicular to an upper surface of the substrate 100.

In an embodiment, a width of one of the grooves 100Gv may be substantially same as a width of another one of the grooves. For example, a first width d1-1 of one of the grooves 100Gv may be substantially same as a second width d2-1 of another one of the grooves 100Gv. Here, the widths of the grooves 100Gv may denote distances in an x-direction.

In an embodiment, protrusions 103P may be respectively between adjacent grooves 100Gv. The protrusions 103P may be apart from one another in the transmission area TA. For example, a first protrusion 103Pa, a second protrusion 103Pb, and a third protrusion 103Pc may be disposed apart from one another. Here, the first protrusion 103Pa and the third protrusion 103Pc may be symmetrical with each other based on the central line CPL. The protrusions 103P and the material of the second base layer 103 may have a same material.

In an embodiment, a width of one of the protrusions 103P may be substantially same as a width of another one of the protrusions. For example, a first length t1-1 of the first protrusion 103Pa in the x-direction may be substantially same as a second length t2-1 of the second protrusion 103Pb in the x-direction.

Referring to FIG. 9B, the grooves 100Gv may have different widths from one another. For example, a first width d1-2 of one of the grooves 100Gv may be different from a second width d2-2 of another one of the grooves 100Gv. Here, the first width d1-2 may be less than the second width d2-2. In some embodiments, the first width d1-2 may be greater than the second width d2-2.

In an embodiment, the first protrusion 103Pa and the second protrusion 103Pb may be symmetrical with each other based on the central line CPL that may be perpendicular to the upper surface of the substrate 100.

In an embodiment, the first protrusion 103Pa and the second protrusion 103Pb may have substantially same width. For example, a first length t1-2 of the first protrusion 103Pa in the x-direction may be substantially same as a second length t2-2 of the second protrusion 103Pb in the x-direction.

In an embodiment, a Fresnel diffraction of the light passing through the transmission area TA may occur. Fresnel diffraction may be a diffraction that occurs in case that at least one of a light source and an observation portion may be at a finite distance with respect to a diffractive object (e.g., a single slit). The grooves 100Gv may have different widths. In particular, the grooves 100Gv may be provided so that the light passing through the grooves 100Gv and the light passing through the first and second protrusions 103Pa and 103Pb constructively interfere with each other. Therefore, a loss in the light proceeding from the thin film encapsulation layer 300 to the component 20 in the direction towards the substrate 100 and in the light proceeding from the component 20 towards the substrate 100 may be reduced.

Referring to FIG. 9C, the protrusions 103P may have different widths from one another. For example, a first length t1-3 of the first protrusion 103Pa in the x-direction may be different from a second length t2-3 of the second protrusion 103Pb in the x-direction. In particular, the first length t1-3 may be greater than the second length t2-3. In some embodiments, the first length t1-3 may be less than the second length t2-3.

In an embodiment, a first width d1-3 of one of the grooves 100Gv may be different from a second width d2-3 of another one of the grooves 100Gv. In particular, the first width d1-3 may be less than the second width d2-3. In some embodiments, the first width d1-3 may be greater than the second width d2-3. As another example, the first width d1-3 may be substantially same as the second width d2-3.

In an embodiment, a Fresnel diffraction of the light passing through the transmission area TA may occur. Here, the widths of the protrusions 103P and the widths of the grooves 100Gv may be different from one another. In particular, the protrusions 103P and the grooves 100Gv may be arranged such that the light passing through the grooves 100Gv and the light passing through the protrusions 103P may constructively interfere with each other. Therefore, a loss in the light proceeding from the thin film encapsulation layer 300 to the component 20 in the direction towards the substrate 100 and in the light proceeding from the component 20 towards the substrate 100 may be reduced.

Hereinafter, a method of manufacturing the display device including the grooves 100Gv in the substrate 100 will be described below.

Figure 10A:
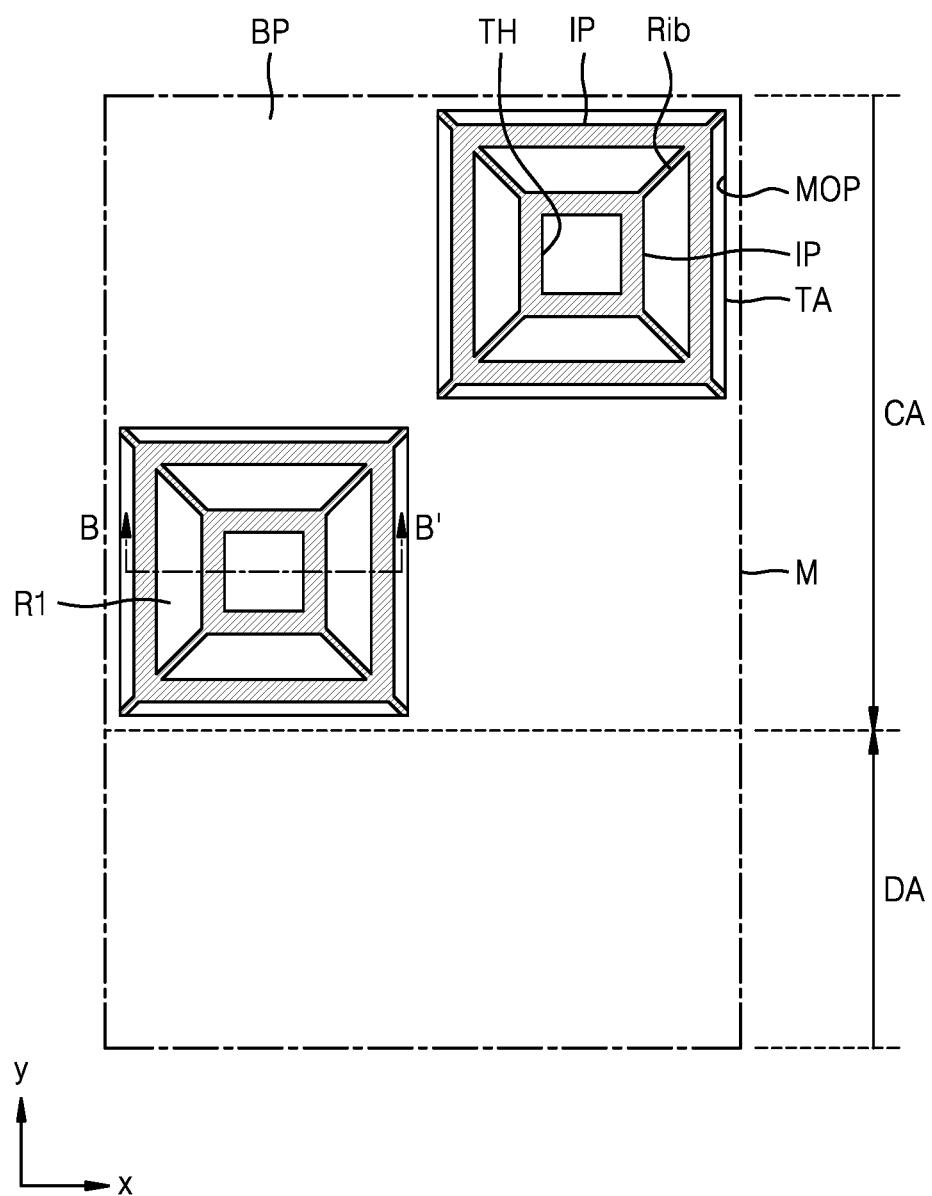
FIG. 10A is a schematic plan view in which an exposure mask corresponds to a component area and a display area.

FIG. 10A is a schematic plan view in which an exposure mask may correspond to a component area CA and a display area DA. FIGS. 10B to 10E are schematic cross-sectional views illustrating processes in a method of manufacturing a display device according to an embodiment. FIGS. 10B to 10E are schematic cross-sectional views of the display device taken along line B-B' of FIG. 10A.

Referring to FIG. 10A, a photoresist layer (not shown) may be arranged corresponding to the component area CA. Here, the photoresist layer may be one of a positive type or a negative type and may be applied onto the component area CA. In detail, in a photoresist layer of a positive type, a region exposed to light may be etched during a developing process, and on the contrary, in a photoresist layer of a negative type, a region other than a region exposed to light may be etched. Hereinafter, the case in which the photoresist layer may be of a positive type will be described in detail.

The photoresist layer may be obtained by applying a photoresist liquid (not shown) onto the substrate by various methods such as a spin-coating method, a spraying method, or an immersion method.

Also, before applying the photoresist layer on the upper surface of the substrate 100, a process of polishing the upper surface of the substrate 100 may be additionally performed.

Next, an exposure mask M including a mask opening MOP may be arranged to correspond to the component area CA and the display area DA.

The exposure mask M may include a body portion BP, at least one island portion IP including a through hole TH, and at least one rib extending the at least one island portion IP to the body portion BP.

The body portion BP may include the mask opening MOP. The mask opening MOP may vary depending on a shape of the transmission area TA. There may be multiple mask openings MOP in the body portion BP, and the mask openings MOP may be apart from one another. Here, the island portion IP may be in each of the mask openings MOP.

The island portion IP may partially block the mask opening MOP. The island portion IP may include the through hole TH, and may be in the mask opening MOP. In FIG. 10A, two island portions IP may be in each mask opening MOP, but three or more island portions IP may be in each mask opening MOP.

The rib Rib may extend the island portion IP to the body portion BP. Here, the rib Rib may support the island portion IP. At least one rib Rib may be in each mask opening MOP. For example, ribs Rib may be in each mask opening MOP. In FIG. 10A, the ribs Rib may be extended to vertices of each island portion IP, but the ribs Rib may be variously arranged. In an embodiment, a width of the rib Rib may be less than a width of the island portion IP.

Next, the photoresist layer may be exposed to light. Here, regions other than the regions blocked by the island portions IP and the body portion BP in the photoresist layer may be exposed to light. In detail, in the photoresist layer, a first region R1 exposed by the mask opening MOP and the through hole TH may be exposed to light. A region shielded by the rib Rib may not be exposed to light for a short period of time, but may be exposed to light by adjusting an exposure time. For example, the width of the rib Rib may be less than that of the island portion IP. In case that the exposure time may be increased, a region shielded by the island portion IP may not be exposed, but the region shielded by the rib Rib may be exposed to light. Therefore, the region shielded by the rib Rib may be exposed to light regardless of the existence of the rib Rib.

Next, the photoresist layer may be partially removed through a developing process. The photoresist layer may be obtained by using the photoresist liquid of a positive type, and after the developing process, a region except for the first region R1 may be removed from the photoresist layer.

Next, metal patterns and metal layers ML may be provided. In an embodiment, the metal patterns MP and the metal layers ML may be obtained through a plating process. For example, the metal patterns MP and the metal layers ML may be obtained by using an electro-forming method.

Figure 10B:
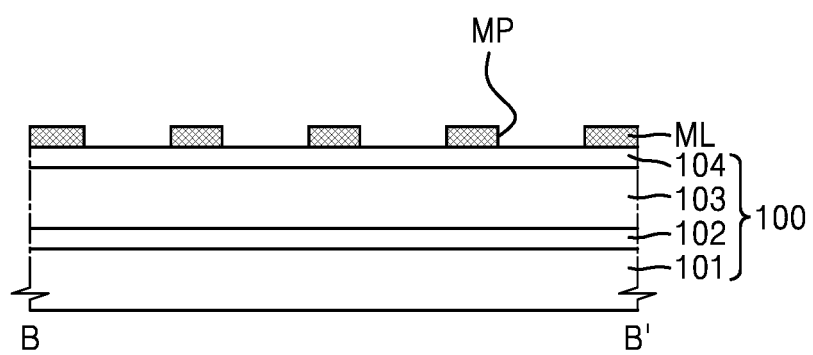
FIGS. 10B to 10E are schematic cross-sectional views illustrating processes in a method of manufacturing a display device according to an embodiment.

Next, referring to FIG. 10B, the remaining photoresist layer may be removed. Here, the metal patterns MP may be apart from one another.

Figure 10C:
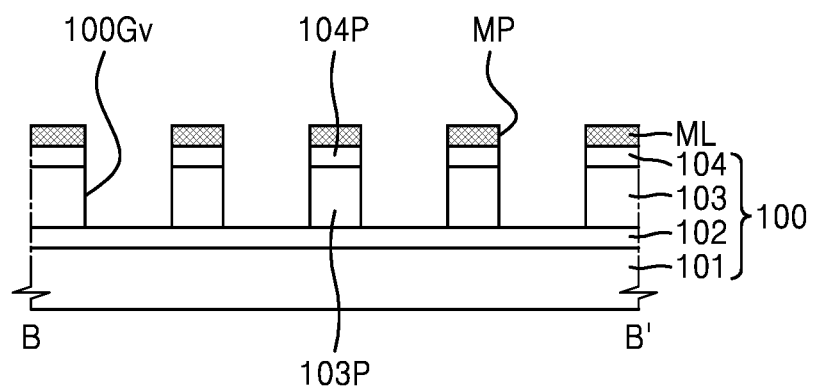

Next, referring to FIG. 10C, the substrate 100 may be etched by using the metal patterns MP as a mask. Here, the etching process may include dry etching. Therefore, the grooves 100Gv may be formed in the substrate 100, corresponding to the component area CA. Also, the protrusions 103P and upper protrusions 104P that may not be etched may be provided among the grooves 100Gv. The protrusion 103P may be a region that may not be etched due to the mask of the metal patterns MP in the second base layer 103. The upper protrusion 104P may be a region that may not be etched due to the mask of the metal patterns MP in the second barrier layer 104.

In an embodiment, the second base layer 103 and the second barrier layer 104 in the substrate 100 may be etched. For example, the second base layer 103 and the second barrier layer 104 may be etched to partially expose an upper surface of the first barrier layer 102. The second base layer 103 and the second barrier layer 104 may be etched for an adjusted etching time.

Figure 10D:
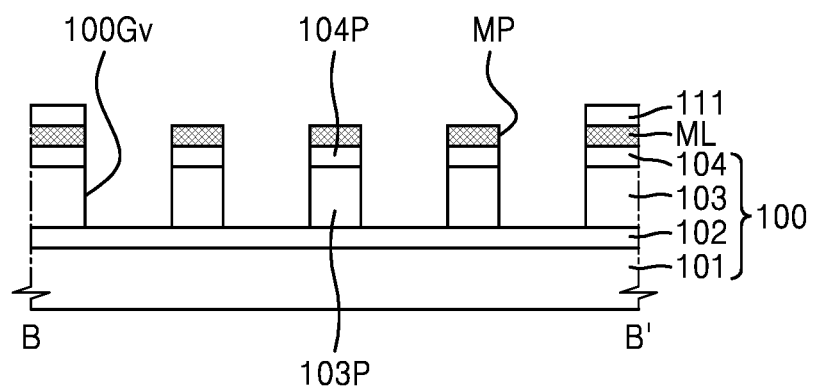

Next, referring to FIG. 10D, the buffer layer 111 may be formed on the metal layers ML. Here, the buffer layer 111 may be formed on the metal layers ML by using a mask shielding the grooves 100Gv.

Figure 10E:
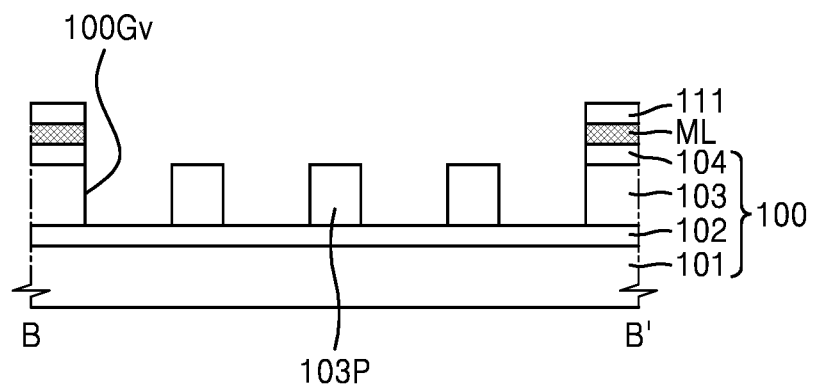

Next, referring to FIG. 10E, the metal patterns MP may be removed. Here, the upper protrusions 104P may be simultaneously removed. The metal patterns MP and the upper protrusions 104P may be removed through an etching process and an ashing process. In particular, the etching process may include wet-etching. As another example, after forming a thick buffer layer 111, a polishing process may be entirely performed to remove the metal patterns MP and the upper protrusions 104P.

Therefore, the display device including the grooves 100Gv in the substrate 100 may be manufactured.

Figure 11A:
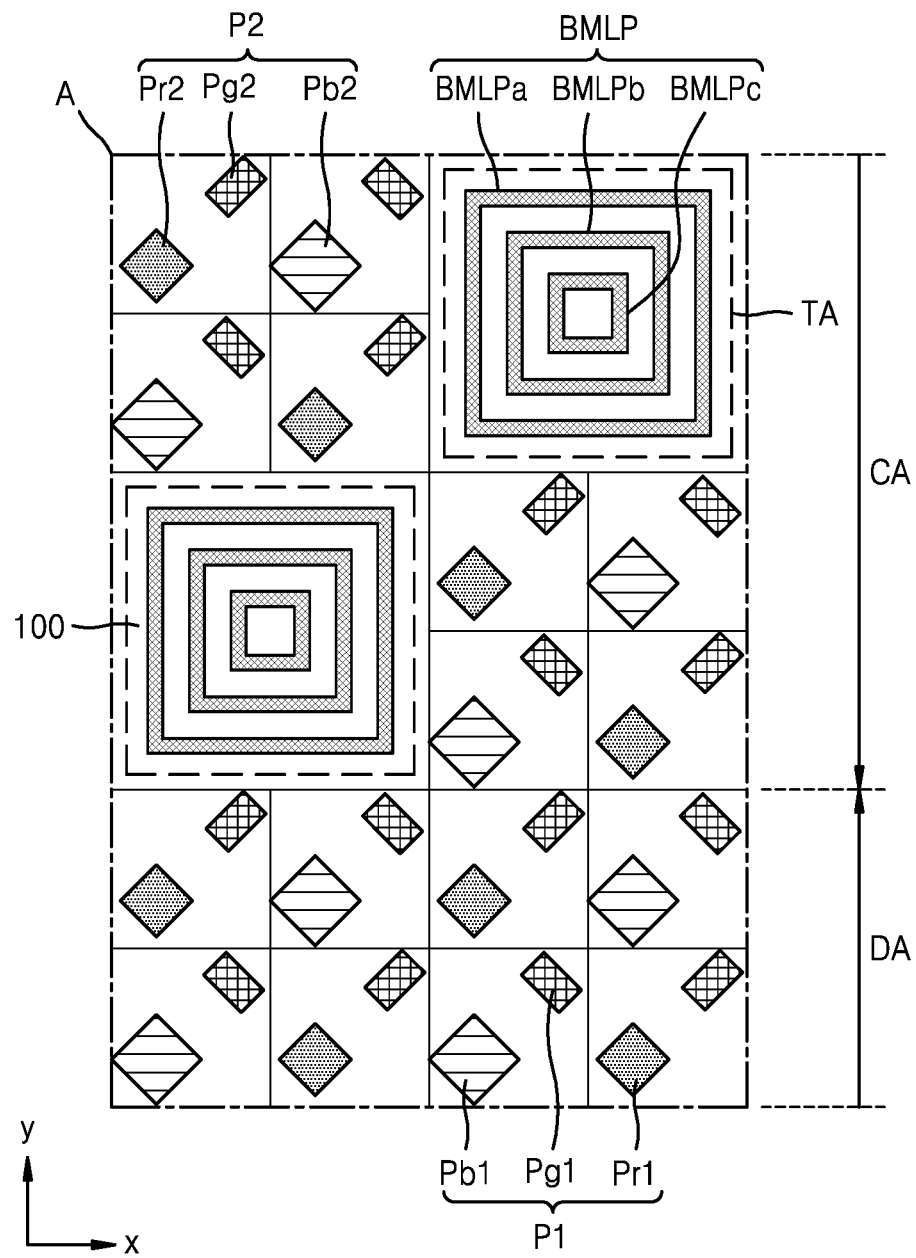
FIG. 11A is an enlarged schematic view of region A in FIG. 3 according to another embodiment.
Figure 11B:
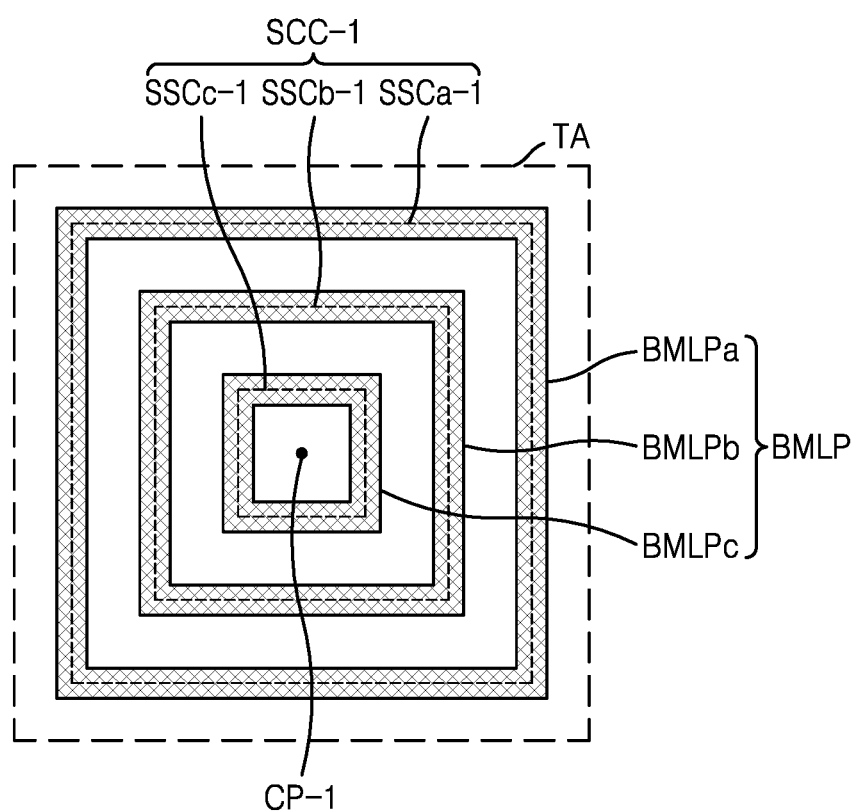
FIG. 11B is an enlarged schematic view of the transmission area of FIG. 11A.
Figure 11C:
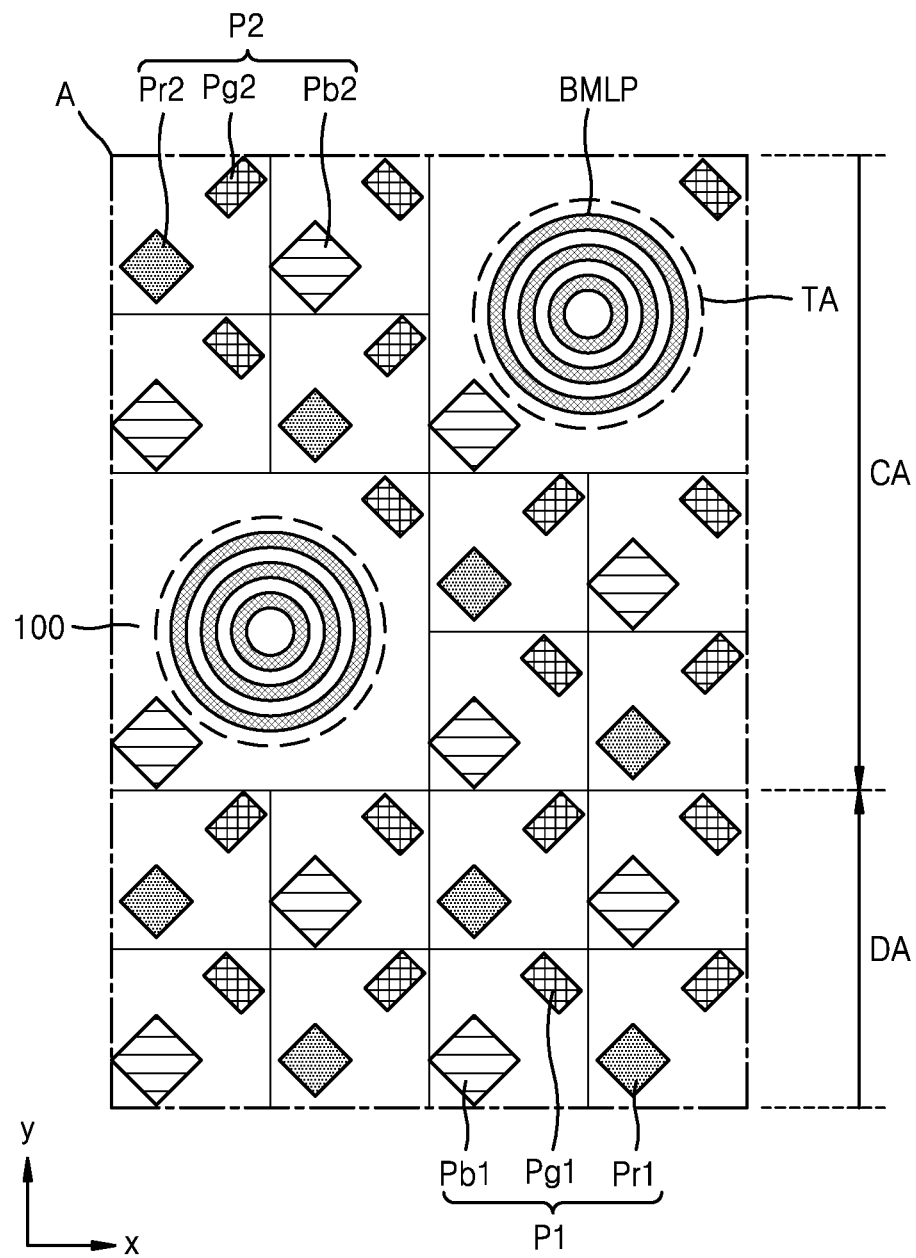
FIG. 11C is an enlarged schematic view of region A in FIG. 3 according to another embodiment.

FIG. 11A is an enlarged schematic view of region A in FIG. 3 according to another embodiment. FIG. 11B is an enlarged schematic view of the transmission area TA of FIG. 11A. FIG. 11C is an enlarged schematic view of region A in FIG. 3 according to another embodiment. In FIGS. 11A to 11C, like reference numerals as those of FIGS. 5A to 5C denote the same members, and thus, descriptions thereof are omitted.

Referring to FIGS. 11A and 11B, the display device may include the substrate 100 which may include the display area DA including a first display element and the component area CA including a second display element and the transmission area TA.

In an embodiment, lower metal patterns BMLP may correspond to the transmission area TA, and may be disposed apart from one another. For example, the lower metal patterns BMLP may include a first lower metal pattern BMLPa, a second lower metal pattern BMLPb, and a third lower metal pattern BMLPc. In another example, the lower metal patterns BMLP may include the first lower metal pattern BMLPa and the second lower metal pattern BMLPb. In another example, the lower metal patterns BMLP may include four or more lower metal patterns. Hereinafter, the case in which the lower metal patterns BMLP include the first lower metal pattern BMLPa, the second lower metal pattern BMLPb, and the third lower metal pattern BMLPc as shown in FIG. 11A will be described in detail below.

In an embodiment, the lower metal patterns BMLP may extend to form a closed line shape in the transmission area TA. For example, the lower metal patterns BMLP may extend along virtual single closed curves SCC-1 in the transmission area TA. Here, the closed line shape (e.g., single closed curve SCC-1) may denote a closed figure having a starting point and an ending point that may be the same as each other, e.g., a polygon, a circle, or an ellipse. For example, the first lower metal pattern BMLPa may extend to form a closed line shape (e.g., along a virtual first single closed curve SCCa-1). The second lower metal pattern BMLPb may extend to form a closed line shape (e.g., along a virtual second single closed curve SCCb-1). The third lower metal pattern BMLPc may extend to form a closed line shape (e.g., along a virtual third single closed curve SCCc-1).

In an embodiment, central points CP-1 of the single closed curves SCC-1 may be the same as one another. For example, the first single closed curve SCCa-1, the second single closed curve SCCb-1, and the third single closed curve SCCc-1 may have the same central points CP-1. Here, the single closed curves SCC-1 may be in a similarity relationship with each other.

In an embodiment, the first lower metal pattern BMLPa may surround the second lower metal pattern BMLPb. Also, the second lower metal pattern BMLPb may surround the third lower metal pattern BMLPc.

Referring to FIG. 11B, the lower metal patterns BMLP may be provided in rectangular shapes. In detail, the first single closed curve SCCa-1 may have a rectangular shape. Therefore, the first lower metal pattern BMLPa may extend in a rectangular shape. Also, the second lower metal pattern BMLPb and the third lower metal pattern BMLPc may extend in rectangular shapes. In particular, in some embodiments, the lower metal patterns BMLP may be provided in square shapes.

Referring to FIG. 11C, the lower metal patterns BMLP may include curvature areas. In particular, the lower metal patterns BMLP may have circular shapes or elliptical shapes. Here, the lower metal patterns BMLP may be in the similarity relationship with one another.

In an embodiment, the lower metal patterns BMLP may be provided to prevent the light from being diffracted while passing through the transmission area TA. In particular, in case that the lower metal patterns BMLP are in the similarity relationship, the diffraction may be further reduced.

Figure 12A:
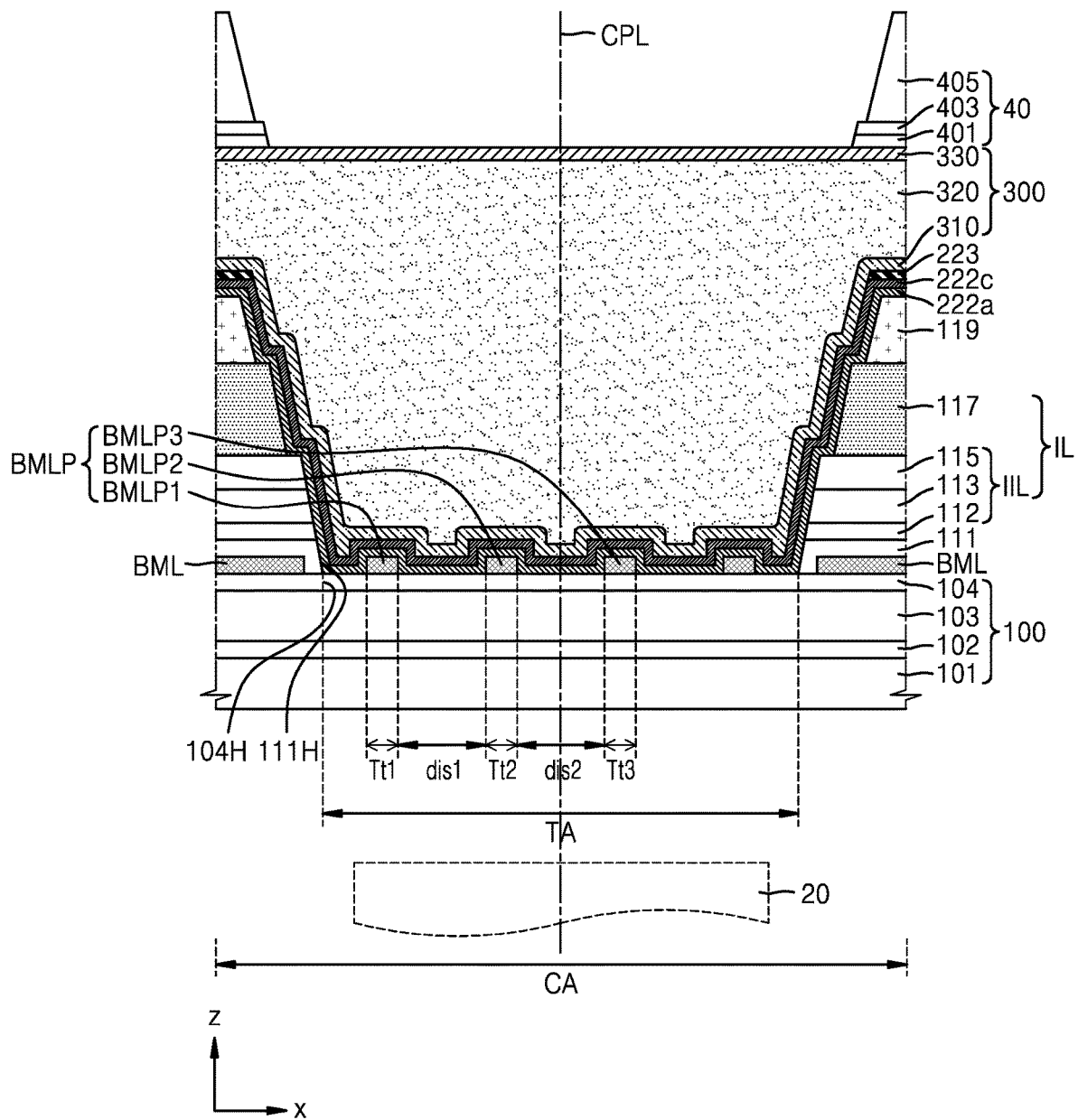
FIGS. 12A to 12C are schematic cross-sectional views showing an enlarged view of a transmission area according to another embodiment.
Figure 12B:
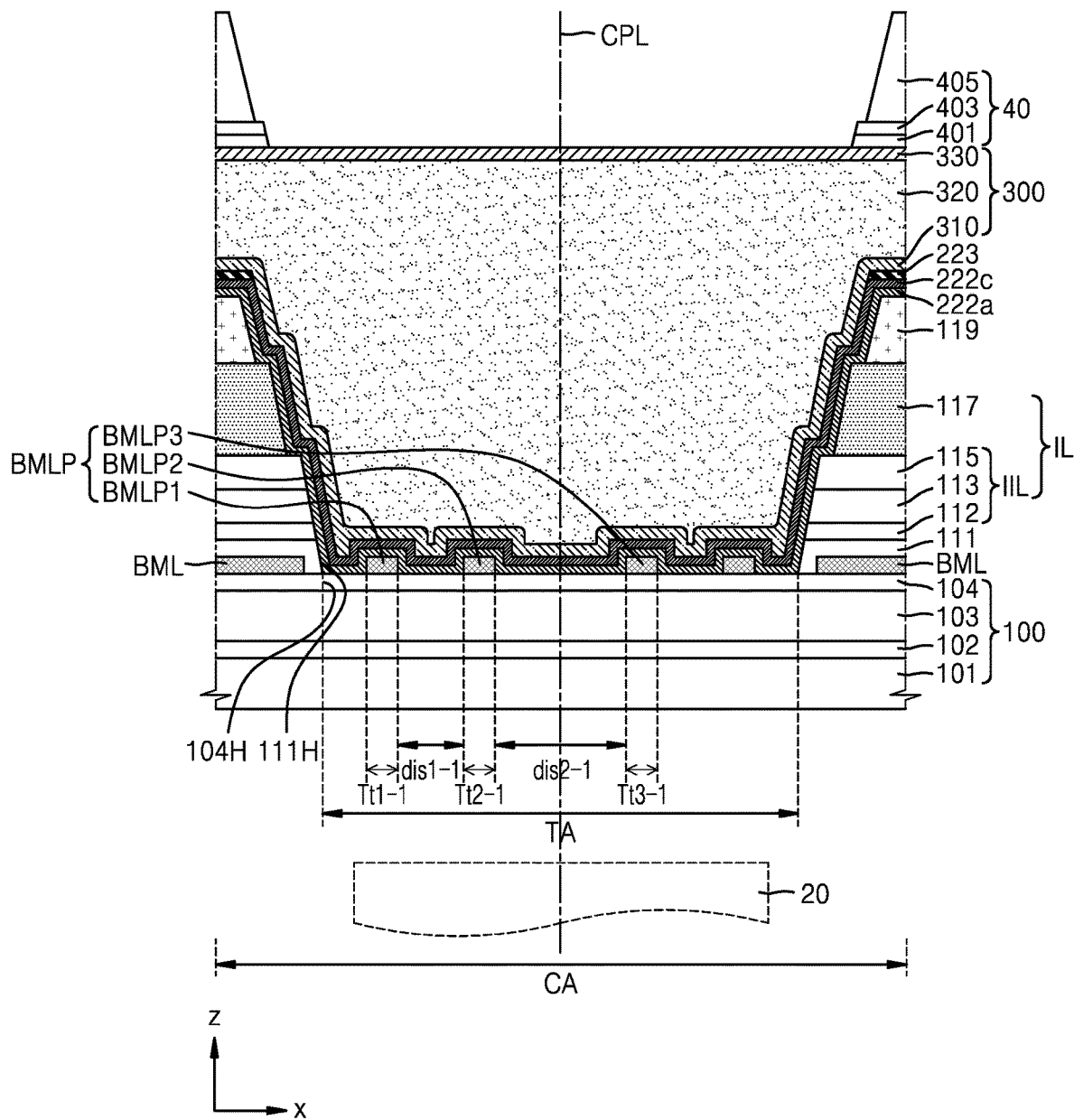
Figure 12C:
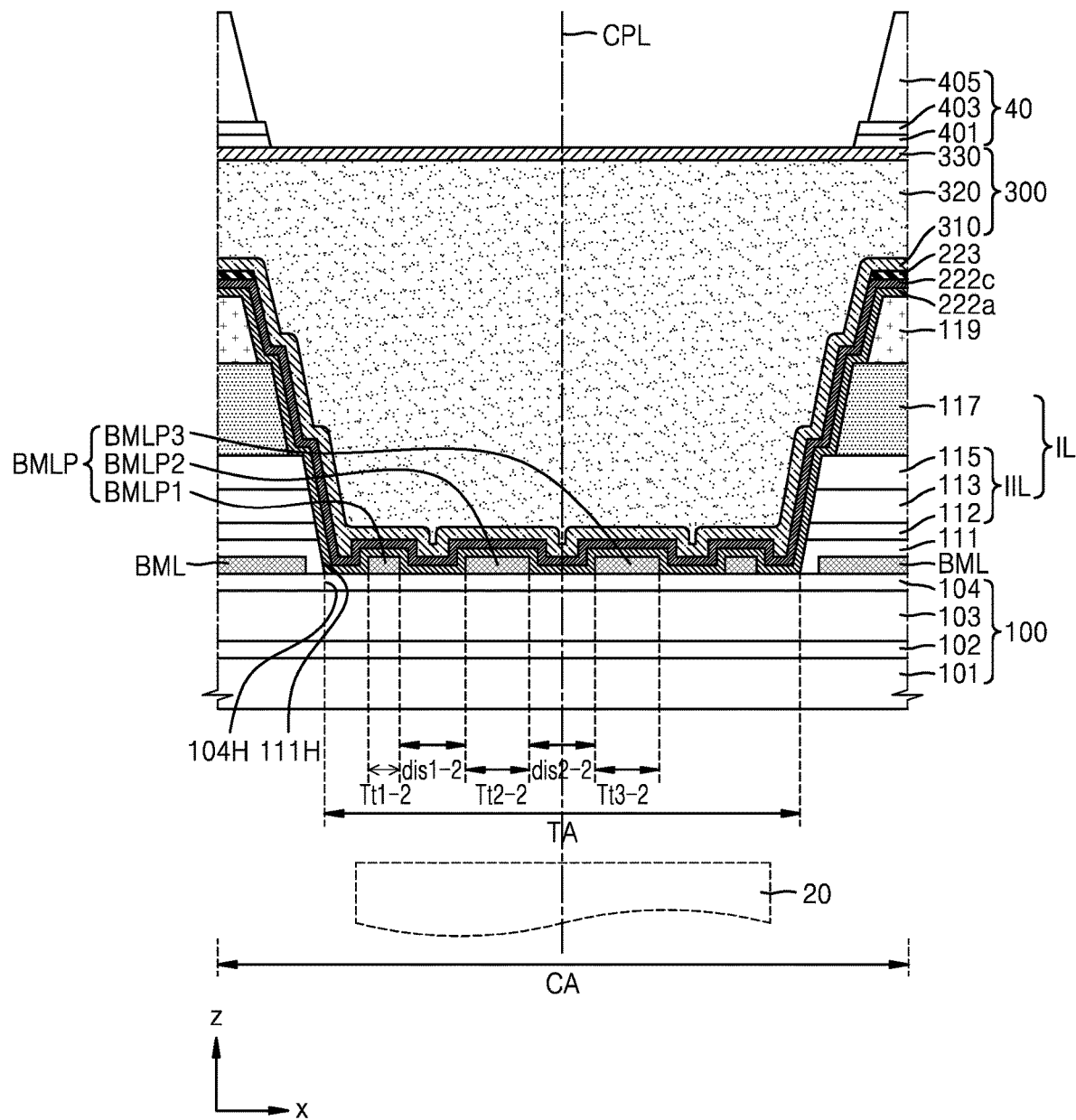

FIGS. 12A to 12C are schematic cross-sectional views showing an enlarged view of a transmission area TA according to another embodiment. In FIGS. 12A to 12C, like reference numerals as those of FIGS. 9A to 9C denote the same members, and thus, descriptions thereof are omitted.

Referring to FIGS. 12A to 12C, the display device may include the substrate 100 including a display area and the component area CA in which the transmission area TA may be provided. Here, the lower metal patterns BMLP corresponding to the transmission area TA may be on the substrate 100 to be apart from one another.

In an embodiment, the substrate 100 may include the first base layer 101, the first barrier layer 102, the second base layer 103, and the second barrier layer 104. In some embodiments, the substrate 100 may include glass.

In an embodiment, the lower metal layer BML may be between the substrate 100 and a second display element (not shown). In detail, the lower metal layer BML may be between the substrate 100 and the buffer layer 111. The lower metal layer BML and the lower metal patterns BMLP may be in a same layer, and the lower metal layer BML may be apart from the lower metal patterns BMLP. The lower metal patterns BMLP and lower metal layer BML may include a same material.

In an embodiment, the lower metal patterns BMLP may be in the transmission area TA. In detail, the lower metal patterns BMLP may be in a third transmission hole 111H of the buffer layer 111.

In an embodiment, the first inorganic encapsulation layer 310 and the organic encapsulation layer 320 may be on the lower metal patterns BMLP. In particular, the first inorganic encapsulation layer 310 may be arranged along the shapes of the lower metal patterns BMLP. In detail, the first inorganic encapsulation layer 310 may be arranged along side surfaces and upper surfaces of the lower metal patterns BMLP.

In an embodiment, the lower metal patterns BMLP may be symmetrically arranged based on the central line CPL that may be perpendicular to the upper surface of the substrate 100.

In an embodiment, one of the lower metal patterns BMLP may have substantially same width as a width of another one of the lower metal patterns. For example, among the lower metal patterns BMLP, a first width Tt1 of a first pattern BMLP1, a second width Tt2 of a second pattern BMLP2, and a third width Tt3 of a third pattern BMLP3 may be substantially same as one another.

In an embodiment, intervals of the lower metal patterns BMLP may be substantially same as one another. For example, a first distance dis1 between the first pattern BMLP1 and the second pattern BMLP2 and a second distance dis2 between the second pattern BMLP2 and the third pattern BMLP3 may be substantially same as each other.

In an embodiment, diffraction of light proceeding from the thin film encapsulation layer 300 to the component 20 in a direction towards the substrate 100 or light proceeding from the component 20 towards the substrate 100 may be prevented. In case that the lower metal patterns BMLP are on the substrate 100, the lower metal patterns BMLP may function as multiple slits, and thus, loss of light caused by the diffraction may be reduced and signal or image distortion caused by the diffraction may be reduced.

Referring to FIG. 12B, a distance between the adjacent lower metal patterns BMLP may be different from a distance between other adjacent lower metal patterns BMLP.

For example, a first distance dis1-1 between the first pattern BMLP1 and the second pattern BMLP2 may be different from a second distance dis2-1 between the second pattern BMLP2 and the third pattern BMLP3. Here, a first width Tt1-1 of the first pattern BMLP1, a second width Tt2-1 of the second pattern BMLP2, and a third width Tt3-1 of the third pattern BMLP3 may be substantially same as one another.

Referring to FIG. 12C, a width of one of the lower metal patterns BMLP may be different from a width of another one of the lower metal patterns BMLP. For example, a first width Tt1-2 of the first pattern BMLP1 may be different from a second width Tt2-2 of the second pattern BMLP2. Here, the first width Tt1-2 may be less than the second width Tt2-2. In some embodiments, the first width Tt1-2 may be greater than the second width Tt2-2.

In the example shown in FIG. 12B or FIG. 12C, Fresnel diffraction of the light passing through the transmission area TA may occur. Here, the intervals among the lower metal patterns BMLP and the widths of the lower metal patterns BMLP may be different from one another. In particular, the intervals among the lower metal patterns BMLP and the width of each of the lower metal patterns BMLP may be set such that rays of light passing respectively between the adjacent lower metal patterns BMLP may constructively interfere with each other. Therefore, a loss in the light proceeding from the thin film encapsulation layer 300 to the component 20 in the direction towards the substrate 100 and in the light proceeding from the component 20 towards the substrate 100 may be reduced.

As described above, according to the embodiment, the diffraction of light may be reduced by including the grooves corresponding to the transmission area in the substrate.

Also, according to another embodiment, the diffraction of light may be reduced by including the lower metal patterns that may be apart from one another to correspond to the transmission area.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display device comprising:
   a substrate comprising a display area and a component area including a transmission area; and
   display elements disposed on the substrate, wherein
   the substrate comprises grooves corresponding to the transmission area of the component area.

2. The display device of claim 1, wherein
the grooves respectively extend to form a closed line shape in the transmission area, and
the grooves include a first groove and a second groove, the first groove surrounding the second groove.

3. The display device of claim 1, wherein the grooves are symmetrically disposed based on a central line that is perpendicular to an upper surface of the substrate.

4. The display device of claim 1, wherein
the substrate comprises a base layer and a barrier layer disposed on the base layer,
the barrier layer comprises a first transmission hole corresponding to the transmission area,
the grooves are disposed in the base layer and extending to the first transmission hole, and
a depth of the grooves is substantially same as a thickness of the base layer.

5. The display device of claim 1, further comprising:
an insulating layer disposed between the substrate and the display elements, the insulating layer comprising a second transmission hole corresponding to the transmission area; and
a thin film encapsulation layer comprising an inorganic encapsulation layer and an organic encapsulation layer, the thin film encapsulation layer covering the display elements.

6. The display device of claim 5, wherein the inorganic encapsulation layer extends to the second transmission hole and is disposed along the grooves.

7. The display device of claim 5, wherein the organic encapsulation layer extends to the second transmission hole and is filled in the grooves.

8. The display device of claim 1, wherein a width of one of the grooves is substantially same as a width of another one of the grooves.

9. The display device of claim 1, wherein a width of one of the grooves is different from a width of another one of the grooves.

10. The display device of claim 1, further comprising protrusions disposed between adjacent ones of the grooves.

11. The display device of claim 10, wherein a width of one of the protrusions is different from a width of another one of the protrusions.

12. The display device of claim 1, further comprising a component under the substrate, the component corresponding to the component area.

13. A display device comprising:
a substrate comprising:
a display area including a first display element;
a component area including a second display element and a transmission area; and
lower metal patterns on the substrate, the lower metal patterns corresponding to the transmission area and being disposed apart from one another.

14. The display device of claim 13, wherein
the lower metal patterns respectively extend to form a closed line shape in the transmission area, and
the lower metal patterns include a first lower metal pattern and a second lower metal pattern, the first lower metal pattern surrounding the second lower metal pattern.

15. The display device of claim 13, wherein the lower metal patterns are symmetrically disposed based on a central line that is perpendicular to an upper surface of the substrate.

16. The display device of claim 13, wherein
the lower metal patterns have a substantially same width, and
intervals among the lower metal patterns are substantially same each other.

17. The display device of claim 13, wherein an interval between adjacent ones of the lower metal patterns is different from an interval between other adjacent ones of the lower metal patterns.

18. The display device of claim 13, wherein a width of a first lower metal pattern is different from a width of a second lower metal pattern.

19. The display device of claim 13, further comprising a lower metal layer between the substrate and the second display element,
wherein the lower metal patterns and the lower metal layer are disposed in a same layer.

20. The display device of claim 19, further comprising a buffer layer covering the lower metal layer, the buffer layer comprising a third transmission hole corresponding to the transmission area.

21. The display device of claim 13, further comprising a component disposed under the substrate, the component corresponding to the component area.

* * * * *